US012791752B2

(12) United States Patent
Bordakov et al.

(10) Patent No.: US 12,791,752 B2
(45) Date of Patent: Nov. 10, 2026

(54) SYSTEMS AND METHODS FOR ENHANCED FORMATION EVALUATION USING T1-T2 MAPS

(71) Applicant: Schlumberger Technology Corporation, Sugar Land, TX (US)

(72) Inventors: George Alexis Bordakov, Sugar Land, TX (US); Shin Utsuzawa, Sugar Land, TX (US); David F. Allen, Sugar Land, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 0 days.

(21) Appl. No.: 19/140,379

(22) PCT Filed: Feb. 2, 2024

(86) PCT No.: PCT/US2024/014264
§ 371 (c)(1),
(2) Date: Jun. 18, 2025

(87) PCT Pub. No.: WO2024/163904
PCT Pub. Date: Aug. 8, 2024

(65) Prior Publication Data

US 2026/0110818 A1 Apr. 23, 2026

Related U.S. Application Data

(60) Provisional application No. 63/483,174, filed on Feb. 3, 2023.

(51) Int. Cl.
*G01V 3/38* (2006.01)
*G01N 24/08* (2006.01)
(Continued)

(52) U.S. Cl.
CPC .......... *G01V 3/38* (2013.01); *G01R 33/5608* (2013.01); *G01V 3/32* (2013.01); *G01N 24/081* (2013.01);
(Continued)

(58) Field of Classification Search
CPC ........ G01V 3/38; G01V 3/32; G01R 33/5608; G01R 33/3808; G01R 33/5617; G01N 24/081
See application file for complete search history.

(56) References Cited

U.S. PATENT DOCUMENTS 5,363,041 A 11/1994 Sezginer
5,381,092 A 1/1995 Freedman
(Continued)

OTHER PUBLICATIONS

International Search Report and Written Opinion of International Patent Application No. PCT/US2024/014264 dated on May 31, 2024, 09 pages.
(Continued)

*Primary Examiner* — Rishi R Patel
(74) *Attorney, Agent, or Firm* — Jeffrey D. Frantz

(57) ABSTRACT

The present disclosure relates to various systems and methods for utilizing these T1-T2 maps for enhanced formation evaluation. For example, as described in greater detail herein, these techniques include: (1) Tikhonov regularization used in an NMR inversion and resultant bias, (2) variable depth averaging of NMR two-dimensional (2D) maps on per T1-T2 basis, and (3) NMR kernel correction.

22 Claims, 23 Drawing Sheets

(51) Int. Cl.

| | |
|---|---|
| ***G01R 33/38*** | (2006.01) |
| ***G01R 33/56*** | (2006.01) |
| ***G01R 33/561*** | (2006.01) |
| ***G01V 3/32*** | (2006.01) |

(52) U.S. Cl.
CPC ...... *G01R 33/3808* (2013.01); *G01R 33/5617* (2013.01)

(56) References Cited

U.S. PATENT DOCUMENTS

| | | | | |
|---|---|---|---|---|
| 6,140,818 | A | 10/2000 | Hurlimann | |
| 8,547,093 | B2 | 10/2013 | Minh | |
| 10,353,107 | B2 | 7/2019 | Allen | |
| 2003/0210043 | A1 | 11/2003 | Freedman | |
| 2007/0222443 | A1 | 9/2007 | Blanz | |
| 2015/0177351 | A1* | 6/2015 | Venkataramanan ..... | G01V 3/32<br>324/309 |
| 2016/0109613 | A1* | 4/2016 | Paulsen .................... | G01V 3/38<br>324/303 |
| 2020/0174153 | A1* | 6/2020 | Song ........................ | G01V 3/32 |
| 2020/0291763 | A1 | 9/2020 | Utsuzawa | |
| 2021/0063600 | A1 | 3/2021 | Li | |

OTHER PUBLICATIONS

Dutta, S. et al., “Modeling tools for drilling, reservoir navigation, and formation evaluation” Journal of Systemics, Cybernetics and Informatics, 2012, pp. 81-87. 10(3).

“Deed—Attribution-ShareAlike 3.0 Unported”, Creative Commons, Retrieved from the internet: https://creativecommons.org/licenses/by-sa/3.0/, Retrieved date—Apr. 29, 2026, 5 pages.

Anand, V. et. al., “New Generation NMR Tool for Robust, Continuous T1 and T2 Measurements”, SPWLA 56th Annual Logging Symposium, SPWLA-2015-CC, Jul. 18, 2015, pp. 1-12.

Duan, C. et. al., “Effect of Off-Resonance on T1 saturation recovery measurement in Inhomogeneous fields”, Journal of Magnetic Resonance, 2017, pp. 31-43, vol. 281.

Golub, G. H. et. al., “Generalized cross-validation as a method for choosing a good ridge parameter”, Technometrics, May 1979, pp. 215-223, vol. 21, No. 2.

Hurlimann, M. D. et. al., “Spin Dynamics of Carr-Purcell-Meiboom-Gill-like Sequences in Grossly Inhomogeneous B0 and B1 Fields and Application to NMR Well Logging”, Journal of Magnetic Resonance, 2000, pp. 120-135, vol. 143.

Prange, M. et. al., “Understanding Nmr T2 Spectral Uncertainty”, Journal of Magnetic Resonance, 2010, pp. 118-123, vol. 204.

Song, Y.-Q. et. al., “T(1)-T(2) Correlation Spectra Obtained Using a Fast Two-Dimensional Laplace Inversion”, Journal of Magnetic Resonance, 2002, pp. 261-268, vol. 154.

Venkataramanan, L. et. al., “An Unsupervised Learning Algorithm to Compute Fluid Volume from NMR T1-T2 Logs in Unconventional Reservoirs”, Petrophysics, Oct. 2018, pp. 617-632, vol. 59, No. 5.

* cited by examiner

SYSTEMS AND METHODS FOR ENHANCED FORMATION EVALUATION USING T1-T2 MAPS

CROSS-REFERENCE TO RELATED APPLICATIONS

The present application is the National Stage Entry of International Application No. PCT/US2024/014264, filed on Feb. 2, 2024, which claims priority benefit of U.S. Provisional Application No. 63/483,174, filed Feb. 3, 2023, the entirety of which is incorporated by reference herein and should be considered part of this specification.

BACKGROUND

This disclosure relates generally to systems and methods for enhanced formation evaluation using T1-T2 maps.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

A key objective for formation evaluation including unconventional reservoirs is to estimate reservoir quality by quantifying the volumes of different fluid components. Nuclear magnetic resonance (NMR) tools have the capability and sensitivity to partition the hydrocarbon and water into fluid components based on their properties and location in the pore space. These tools add valuable information to nuclear spectroscopy-based tools capable to estimate the total organic carbon in a reservoir as well as to resistivity and dielectric tools sensitive to the water-filled porosity.

Multi wait time NMR measurements are able to provide the most complete fluid components characterization information. These measurements are special data acquisition schemes that directly encode T1 and T2 information in the data. These data may be inverted into T1-T2 maps that show unique signatures for hydrocarbons, such as gas, bitumen, and producible and bound oil. Likewise, capillary and clay-bound water and water in larger pores may be characterized by different signatures. These signatures indicating properties of the fluids, properties of the rock and the geometrical configuration of fluid phases within the pore space may be investigated both visually as well as automatically using machine learning techniques.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Certain embodiments of the present disclosure relate to a method that includes building a computational model for a nuclear magnetic resonance (NMR) downhole tool as a virtual prototype. The virtual prototype models NMR echo trains for the NMR downhole tool. The method also includes performing virtual prototyping on NMR acquisition sequences with a set of T1-T2 sources for T1-T2 pairs for one or more downhole wells to produce virtual prototyping results. T1 and T2 are representative of first and second relaxation times detected by the NMR downhole tool. The method further includes performing a simulation to determine synthetic data of the virtual prototyping results. In addition, the method includes performing NMR inversion of T1-T2 maps by applying Tikhonov regularization to invert fluid volumes from the synthetic data. The method also includes correcting inverted T1-T2 maps for bias using the NMR inversion.

Certain other embodiments of the present disclosure relate to a method that includes building a computational model for an NMR downhole tool as a virtual prototype, wherein the virtual prototype models NMR echo trains for the NMR downhole tool. The NMR echo trains are acquired for a specific depth interval. The method also includes performing virtual prototyping on NMR acquisition sequences with a set of T1-T2 sources for T1-T2 pairs for one or more downhole wells to produce virtual prototyping results. T1 and T2 are representative of first and second relaxation times detected by the NMR downhole tool. The method further includes performing a simulation to determine synthetic data of the virtual prototyping results. In addition, the method includes performing NMR inversion of two-dimensional (2D) T1-T2 maps to invert fluid volumes from the synthetic data. The method also includes performing variable depth averaging of the 2D T1-T2 maps on a per T1-T2 basis.

Certain other embodiments of the present disclosure relate to a method that includes building a computational model for an NMR downhole tool as a virtual prototype. The virtual prototype models NMR echo trains for the NMR downhole tool. The method also includes validating the virtual prototype with laboratory experimental data. The method further includes selecting one or more virtual prototype parameters based at least in part on the laboratory experimental data. In addition, the method includes performing virtual prototyping on NMR acquisition sequences with a set of T1-T2 sources for T1-T2 pairs for one or more downhole wells to produce virtual prototyping results. T1 and T2 are representative of first and second relaxation times detected by the NMR downhole tool. The method also includes parameterizing an NMR kernel and its associated parameters as time values corresponding to exponential echo train decay, wherein parameterizing the NMR kernel comprises adjusting amplitudes of acquisition sub-sequences of the NMR acquisition sequences corresponding to different wait times for every T1-T2 pair and a quality factor (Q) of an antenna of the NMR downhole tool to match the virtual prototype. The method further includes performing NMR inversion of T1-T2 maps using an adjusted NMR kernel having parameters adjusted based at least in part on the parameterized NMR kernel.

Various refinements of the features noted above may be undertaken in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

Figure 1:
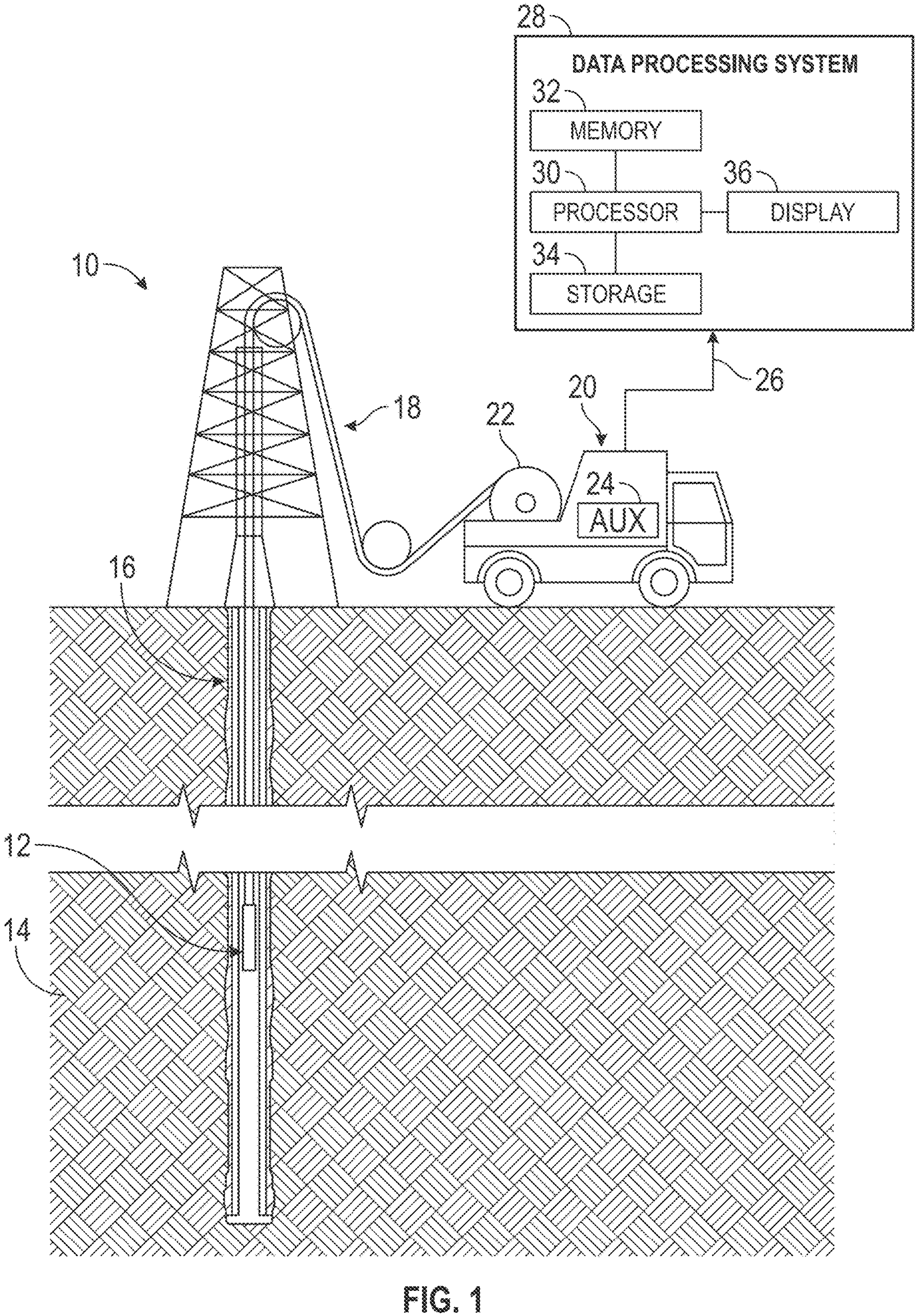
FIG. 1 is a partial cross-sectional view of a well-logging system that may be used to receive and/or analyze nuclear magnetic resonance (NMR) data, in accordance with embodiments of the present disclosure.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements; in other words, these terms are used in an open-ended fashion, and thus should be interpreted to mean "including, but not limited to . . . " Additionally, it should be understood that references to "one embodiment" or "an embodiment" of the present disclosure are not intended to be interpreted as excluding the existence of additional embodiments that also incorporate the recited features. Furthermore, the phrase "A based on B" is intended to mean that A is at least partially based on B. Moreover, unless expressly stated otherwise, the term "or" is intended to be inclusive (e.g., logical OR) and not exclusive (e.g., logical XOR). In other words, the phrase "A or B" is intended to mean A, B, or both A and B.

As used herein, the terms "connect," "connection," "connected," "in connection with," and "connecting" are used to mean "in direct connection with" or "in connection with via one or more elements"; and the term "set" is used to mean "one element" or "more than one element." Further, the terms "couple," "coupling," "coupled," "coupled together," and "coupled with" are used to mean "directly coupled together" or "coupled together via one or more elements." As used herein, the terms "up" and "down," "uphole" and "downhole", "upper" and "lower," "top" and "bottom," and other like terms indicating relative positions to a given point or element are utilized to more clearly describe some elements. Commonly, these terms relate to a reference point as the surface from which drilling operations are initiated as being the top (e.g., uphole or upper) point and the total depth along the drilling axis being the lowest (e.g., downhole or lower) point, whether the well (e.g., wellbore, borehole) is vertical, horizontal or slanted relative to the surface.

In addition, as used herein, the terms "real time", "real-time", or "substantially real time" may be used interchangeably and are intended to describe operations (e.g., computing operations) that are performed without any human-perceivable interruption between operations. For example, as used herein, data relating to the systems described herein may be collected, transmitted, and/or used in control computations in "substantially real time" such that data readings, data transfers, and/or data processing steps occur once every second, once every 0.1 second, once every 0.01 second, or even more frequent, during operations of the systems (e.g., while the systems are operating). In addition, as used herein, the terms "continuous", "continuously", or "continually" are intended to describe operations that are performed without any significant interruption. For example, as used herein, control commands may be transmitted to certain equipment every five minutes, every minute, every 30 seconds, every 15 seconds, every 10 seconds, every 5 seconds, or even more often, such that operating parameters of the equipment may be adjusted without any significant interruption to the closed-loop control of the equipment. In addition, as used herein, the terms "automatic", "automated", "autonomous", and so forth, are intended to describe operations that are performed are caused to be performed, for example, by a computing system (i.e., solely by the computing system, without human intervention). Indeed, it will be appreciated that the data processing system described herein may be configured to perform any and all of the data processing functions described herein automatically.

In addition, as used herein, the term "substantially similar" may be used to describe values that are different by only a relatively small degree relative to each other. For example, two values that are substantially similar may be values that are within 10% of each other, within 5% of each other, within 3% of each other, within 2% of each other, within 1% of each other, or even within a smaller threshold range, such as within 0.5% of each other or within 0.1% of each other.

Similarly, as used herein, the term "substantially parallel" may be used to define downhole tools, formation layers, and so forth, that have longitudinal axes that are parallel with each other, only deviating from true parallel by a few degrees of each other. For example, a downhole tool that is substantially parallel with a formation layer may be a downhole tool that traverses the formation layer parallel to a boundary of the formation layer, only deviating from true parallel relative to the boundary of the formation layer by less than 5 degrees, less than 3 degrees, less than 2 degrees, less than 1 degree, or even less.

In general, oil and gas exploration organizations may make certain oil and gas production decisions, such as determining where to drill and/or whether to perform enhanced oil recovery in a well, based on well log data. One type of well log measurement that is used for generating well log data is a nuclear magnetic resonance (NMR) measurement. Such well log data, or NMR data, may be used to determine a volume of hydrocarbons and/or water, which, in turn, may be used to inform the production decisions. In particular, as discussed above, NMR measurements are special data acquisition schemes that directly encode T1 and T2 information in the data. These data may be inverted into T1-T2 maps that show unique signatures for hydrocarbons, such as gas, bitumen, and producible and bound oil.

The present disclosure relates to various systems and methods for utilizing these T1-T2 maps for enhanced formation evaluation. For example, as described in greater detail herein, these techniques include: (1) Tikhonov regularization used in an NMR inversion and resultant bias, (2) variable depth averaging of NMR two-dimensional (2D) maps on per T1-T2 basis, and (3) NMR kernel correction. Each one of these three techniques will be described individually in greater detail below. Although described primarily herein as being three separate techniques for enabling enhanced formation evaluation using T1-T2 maps, it will be appreciated that the three techniques may indeed be used in combination with each other in certain embodiments. In general the common denominator between each of the three techniques is that they relate to Carr-Purcell-Meiboom-Gill (CPMG) sequence based NMR logging.

With this in mind, FIG. 1 illustrates a well-logging system 10 that may employ the systems and methods of this disclosure. The well-logging system 10 may be used to convey a downhole logging tool 12 through a geological formation 14 via a wellbore 16. The downhole logging tool 12 may be conveyed on a cable 18 via a logging winch system 20. Although the logging winch system 20 is schematically shown in FIG. 1 as a mobile logging winch system carried by a truck, the logging winch system 20 may be substantially fixed (e.g., a long-term installation that is substantially permanent or modular). Any suitable cable 18 for well logging may be used. The cable 18 may be spooled and unspooled on a drum 22 and an auxiliary power source 24 may provide energy to the logging winch system 20 and/or the downhole logging tool 12.

Moreover, although the downhole logging tool 12 is described as a wireline downhole tool, it should be appreciated that any suitable conveyance may be used. For example, the downhole logging tool 12 may instead be conveyed as a logging-while-drilling (LWD) tool as part of a bottom hole assembly (BHA) of a drill string, conveyed on a slickline or via coiled tubing, and so forth. For the purposes of this disclosure, the downhole logging tool 12 may be any suitable measurement tool that obtains NMR logging measurements through depths of the wellbore 16.

Many types of downhole tools may obtain NMR logging measurements in the wellbore 16. These include, for example, nuclear magnetic resonance (NMR) tools such as the Combinable Magnetic Resonance (CMR) tool, the Magnetic Resonance Scanner (MRX) tool, and the ProVISION tool by Schlumberger Technology Corporation. In general, NMR tools may have a permanent magnet that produces a static magnetic field at a desired test location (e.g., where the fluid is located). The static magnetic field produces an equilibrium magnetization in the fluid that is aligned with a magnetization vector along the direction of the static magnetic field. A transmitter antenna produces a time-dependent radio frequency magnetic field that is perpendicular to the direction of the static field. The radio frequency magnetic field produces a torque on the magnetization vector that causes it to rotate about the axis of the applied radio frequency magnetic field. The rotation results in the magnetization vector developing a component perpendicular to the direction of the static magnetic field. This causes the magnetization vector to align with the component perpendicular to the direction of the static magnetic field, and to precess around the static field.

The time for the magnetization vector to re-align with the static magnetic field is known as the longitudinal magnetization recovery time, or "T1 relaxation time." The spins of adjacent atoms precess in tandem synchronization with one another due to the precession of the magnetization vector. The time for the precession of the spins of adjacent atoms to break synchronization is known as the transverse magnetization decay time, or "T2 relaxation time." Thus, the measurements obtained by the downhole logging tool 12 may include distributions of the first relaxation time T1, the second relaxation time T2, or molecular diffusion D, or a combination of these. For example, a downhole NMR tool may measure just T2 distribution, or the tool may measure a joint T1-T2 distribution or T1-T2-D distribution.

For each depth of the wellbore 16 that is measured, a downhole NMR tool may generate NMR logging measurements that include a distribution of amplitudes of T2 relaxation time, T1 relaxation time, diffusion, or a combination thereof. This list is intended to present certain examples and is not intended to be exhaustive. Indeed, any suitable downhole logging tool 12 that obtains NMR logging measurements may benefit from the systems and methods of this disclosure.

The downhole logging tool 12 may provide NMR logging measurements 26 to a data processing system 28 via any suitable telemetry (e.g., via electrical signals pulsed through the geological formation 14 or via mud pulse telemetry). The data processing system 28 may process the NMR logging measurements 26 to identify patterns in the NMR logging measurements 26. The patterns in the NMR logging measurements 26 may indicate certain properties of the wellbore 16 (e.g., viscosity, porosity, permeability, relative proportions of water and hydrocarbons, and so forth) that might otherwise be indiscernible by a human operator.

To this end, the data processing system 28 thus may be any electronic data processing system that can be used to carry out the systems and methods of this disclosure. For example, the data processing system 28 may include a processor 30, which may execute instructions stored in memory 32 and/or storage 34. As such, the memory 32 and/or the storage 34 of the data processing system 28 may be any suitable article of manufacture that can store the instructions. The memory 32 and/or the storage 34 may be ROM memory, random-access memory (RAM), flash memory, an optical storage medium, or a hard disk drive, to name a few examples. A display 36, which may be any suitable electronic display, may provide a visualization, a well log, or other indication of properties in the geological formation 14 or the wellbore 16 using the NMR logging measurements 26.

Figure 2:
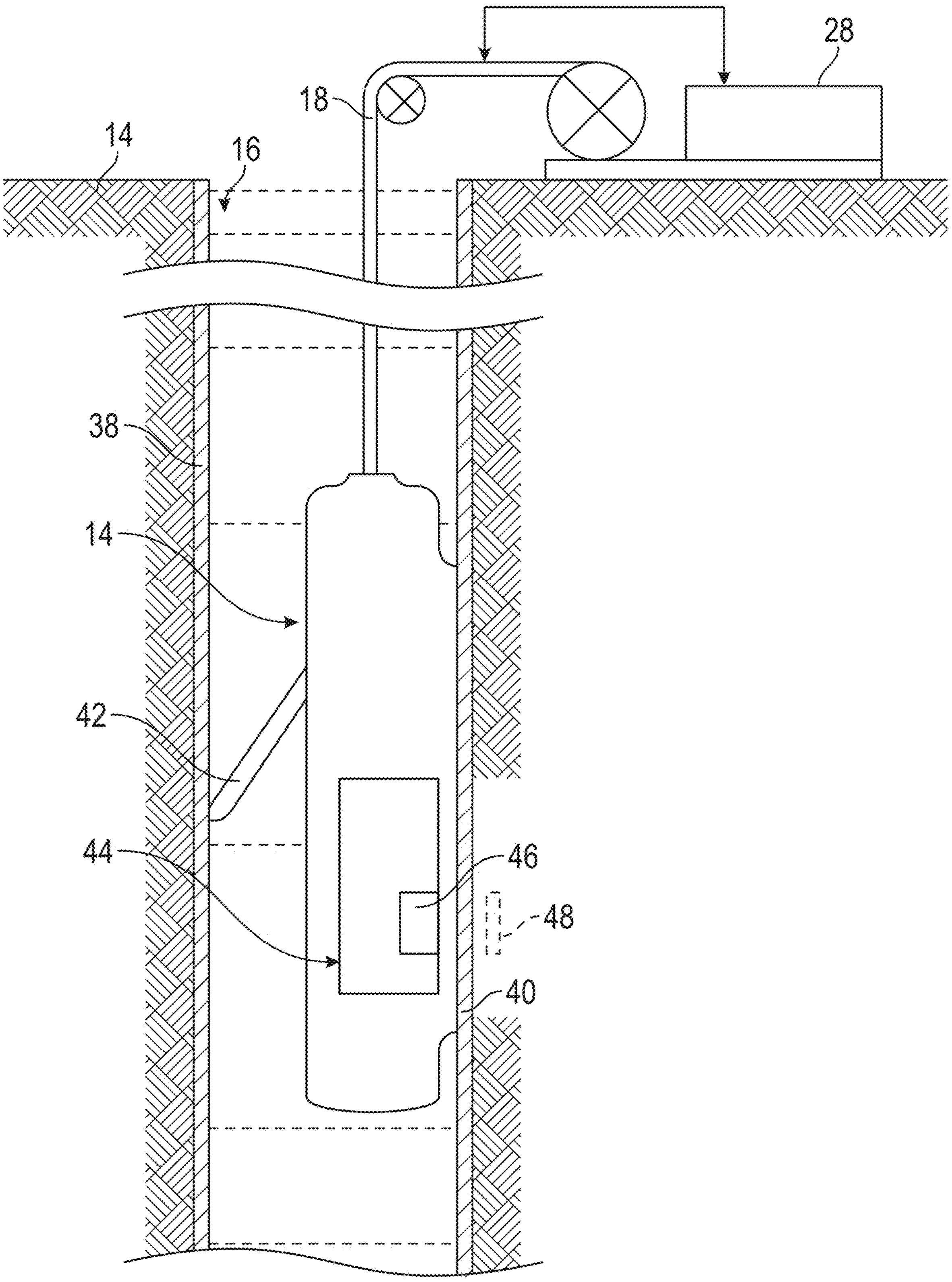
FIG. 2 illustrates an example system for investigating a geological formation traversed by a wellbore, in accordance with embodiments of the present disclosure.
Figure 3A:
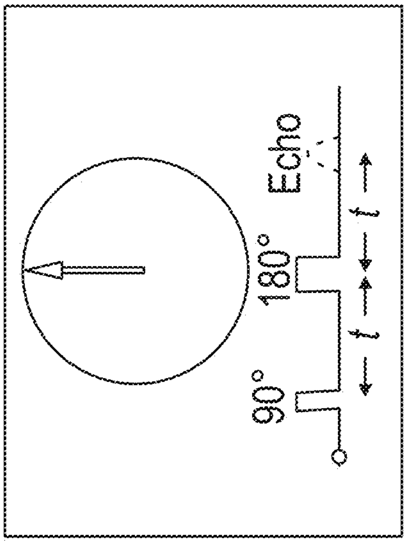
FIG. 3 illustrates still images from an animation of a spin echo, in accordance with embodiments of the present disclosure.
Figure 3B:
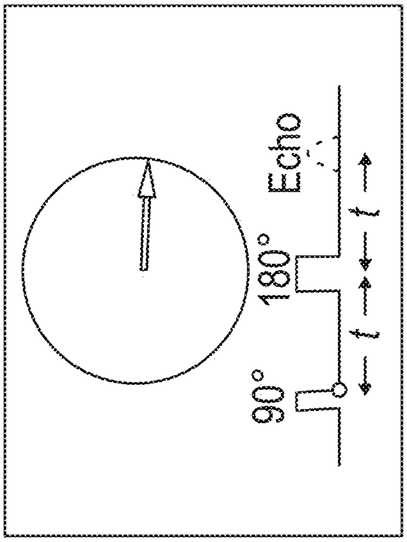
Figure 3C:
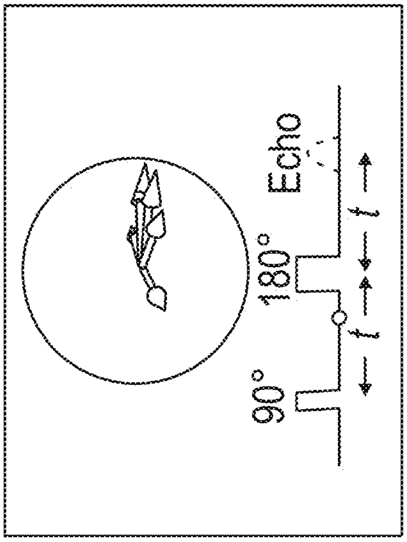
Figure 3D:
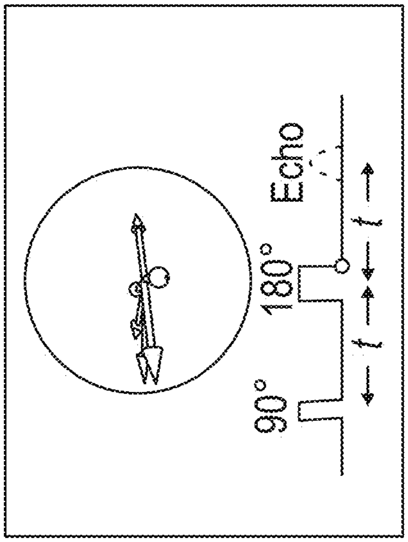
Figure 3E:
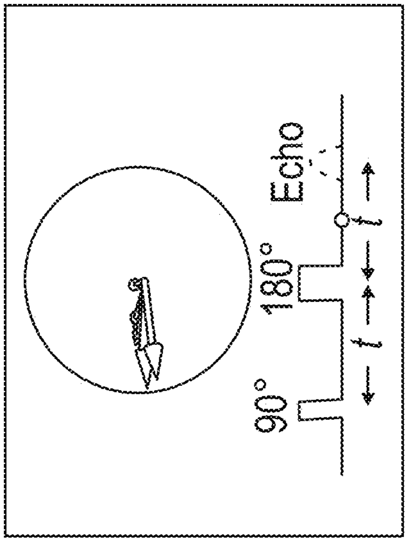
Figure 3F:
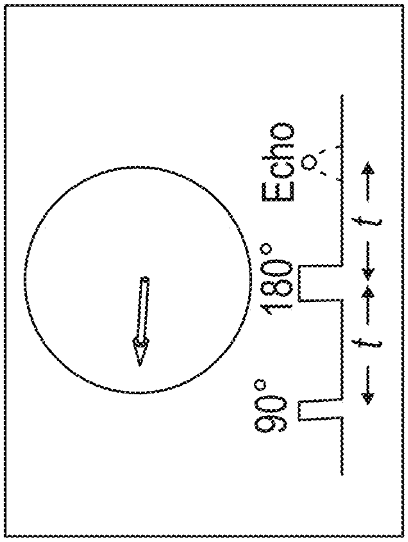

FIG. 2 illustrates an example system for investigating a geological formation 14 traversed by a wellbore 16. The wellbore 16 is typically, although not necessarily, filled with a drilling fluid or mud (which contains finely divided solids in suspension) with mudcake 38 on the walls of the wellbore 16. A downhole logging tool 12 is suspended in the wellbore 16 on a cable 18, the length of which substantially determines the relative depth of the downhole logging tool 12. The cable length may be controlled by suitable means at the surface such as a logging winch system (not shown). In certain embodiments, the downhole logging tool 12 may have a face 40 shaped to directly contact the borehole wall, with minimal gaps or standoff, and a retractable arm 42 which can be activated to press the body of the downhole logging tool 12 against the wellbore 16 during a logging run, with the face 40 pressed against the wellbore 16. Although the downhole logging tool 12 is shown as a single body, in other embodiments, the downhole logging tool 12 may alternatively comprise separate components such as a cartridge, sonde, or skid, and the downhole logging tool 12 may be combinable with other logging tools.

As illustrated in FIG. 2, in certain embodiments, the downhole logging tool 12 may include a permanent magnet assembly 44 as well as an array of radio frequency (RF) antennae (one shown as 46) positioned between permanent magnet assembly 44 and the face 40 of the downhole logging tool 12. The permanent magnet assembly 44 produces a static magnetic field B0 in a sample volume 48. The sample volume 48 is a region directly in front of tool face 40. Thus, during use, the sample volume 48 lies within the formation 14 as shown. The static magnetic field B0 is inhomogeneous due to the design of the permanent magnet assembly 44 and, thus, produces a spatial magnetic field gradient ($\partial B_0/\partial z$) in the sample volume 48. The RF antenna 46 radiates, at selected times, an oscillating RF magnetic field $B_1$ having a magnetic moment substantially perpendicular (orthogonal) to that of the static magnetic field $B_0$ produced by the permanent magnet assembly 44. One of ordinary skill in the art would appreciate that the same RF antenna 46 may function as a transmitter to transmit the oscillating magnetic field and as a receiver to receive the signals. Alternatively, separate transmitter and receiving antennas may be used. Advantages of using the downhole logging tool 12 may include, but are not limited to, the ability to assess various and multiple depths of interest, the ability to probe deeper into a rock formation, sensing of a large region, and easier tuning.

The downhole logging tool 12 may be used to make NMR measurements related to the diffusion and relaxation properties of fluid samples. Because these properties are generally different for oil and water, these measurements can provide a means for determining the relative proportion of water and oil in a fluid sample. In addition, these measurements can provide information on the properties of the oils, including their compositions, viscosities and gas/oil ratios (amounts of solution gas contained in the oil). Similarly, for a fluid sample, which may comprise (1) gas and water, (2) gas, oil, and water, (3) oil and gas, or (4) oil and water, the measurements can provide a means for determining the relative proportions of the different components that are present. In addition, these measurements can provide information on the hydrocarbon properties that are important for determining the monetary value of the reservoir and also essential for making well completion decisions.

Multi Wait Time NMR Measurements and T1-T2 Inversion

The main building block of NMR applications for petrophysics both for in-situ logging and laboratory measurements is CPMG (i.e., Carr-Purcell-Meiboom-Gill sequence). To produce CPMG, a static magnetic field $B_0$ is initially applied for a specific time to the object of interest to polarize the protons or other magnetic nuclei (i.e., to align their magnetic spins in the direction of the static magnetic field). Complete polarization means that all spin vectors are oriented in the direction of the static magnetic field. It corresponds to the maximum object magnetization $M_0$. With time, actual magnetization M approaches the maximum $M_0$ exponentially. Characteristic time of that exponent is called T1—longitudinal or spin-lattice relaxation time. Thus, depending on the time of the static magnetic field application (i.e., wait time), the polarization can be practically complete or partial.

In the static magnetic field, the spins experience precession around the magnetic field vector with the certain frequency $f=\gamma B_0/2\pi$ that is called the Larmor frequency. Here $\gamma$ is the gyromagnetic ratio, which is a measure of the strength of the nuclear magnetism. Subsequently, tipping magnetic field $B_1$, oscillating with the Larmor frequency and perpendicular to $B_0$, is applied for a certain time $\tau$ to reorient the spins. A corresponding pulse of an oscillating electromagnetic field is called a radio-frequency (RF) pulse since the Larmor frequency for typical NMR devices lies in the radio frequencies range. The tipping angle is the angle of the spins' reorientation—$\theta=\gamma B_1\tau$. The first RF pulse in CPMG has a nominal tipping angle of 90°. It reorients the magnetization from the direction longitudinal to the static field $B_0$ to a transverse plane. After an initial RF pulse is finished, spins start to experience their precession being contained in that transverse plane and dephasing starts. Microscopic magnetic field inhomogeneities result in some spins precession being slower due to local filed strength and some being faster. Slower precessing spins start to progressively trail behind while faster start getting ahead. Thus, spins start to lose phase coherency. As dephasing progresses, the net magnetization decreases exponentially with time. Characteristic time of that exponent is called T2—transverse or spin-spin relaxation time.

During this dephasing process, observations of spin echoes are made. The proton spins in the transverse plane are re-phased with the application of 180° tipping angle RF pulse. If a transverse magnetization vector has phase angle $\alpha$, then application of a 180° oscillating field pulse changes the phase angle to $-\alpha$. The phase order of the spins is therefore reversed, and the slower precessing spins are put ahead of the faster ones. The faster spins overtake the slower ones, rephasing occurs, and the receiver antenna coil detects a signal. This signal is called a spin echo. If time $\tau$ transpires between the application of the 90° RF pulse and the 180° RF pulse, then the same time $\tau$ will transpire between the application of the 180° RF pulse and the peak of the spin echo. This time between 90° RF pulse and the spin echo that is twice the time between 90° DF pulse and 180° RF pulse is called the echo time.

FIG. 3 illustrates still images from an animation of a spin echo by Gavin W Morley, CC BY-SA 3.0<https://creativecommons.org/licenses/by-sa/3.0>, via Wikimedia Commons. The red arrows may be thought of as spins. Initially, they are polarized parallel to the static magnetic field (A). Applying the first pulse (B) rotates the spins by 90° positioning them in the transverse plane. The spins then "spread out", experiencing decoherence (C) because each is in a slightly different environment. This decoherence is refocused by a second pulse that rotates the spins by 180° (D). Phase order reverses and slower spins "catch up" with faster spins (E). Finally, refocusing occurs and spin echo is recorded (F).

As soon as decoherence progresses in the transverse plane, the share of spins that are re-focused by 180° RF pulse decreases. Thus, repetition of 180° pulses after a single 90° pulse with some certain constant time spacing (e.g., Carr-Purcell time) and recording maximum amplitude of the corresponding echoes is used to measure the dephasing process. The, corresponding procedure of waiting for a certain polarization in a static magnetic field $B_0$, then applying one 90° tipping angle RF pulse and then a series of evenly spaced in time 180° RF pulses combined with recording of the spin echo amplitudes vs. time in the receiver antenna coil is known as a CPMG sequence. The CPMG sequence renders the echo train (e.g., that is an evenly spaced time series of spin echoes amplitudes). The time spacing of the echo train is called echo spacing TE. Its value is twice the Carr-Purcell time (e.g., the time spacing between 180° RF pulses).

After a period of dephasing equal to several times of the maximum T2, this dephasing is essentially complete, and further rephasing renders no spin echo. The first 90° RF pulse of the CPMG sequence reorients the polarization, eliminating any existing longitudinal polarization while subsequent 180° RF pulses suppress the buildup of new longitudinal polarization. Hence, the spins are completely randomized at the end of a CPMG sequence. To start the next CPMG sequence, the spins must be polarized again. So, a wait time during which repolarization occurs is necessary between the end of one CPMG sequence to the start of the next.

The spin echo signal from the receiver antenna coil is fed into a phase-sensitive detector that outputs two channels of data 90° apart (that phase is not to be confused with 90° tipping angle of the pulse). From these two sensors spin echo apparent signal amplitude and phase can be computed. The phase of the spin echo signal for different time instances in the CPMG sequence and even for different CPMG sequences in one NMR observation is expected to be constant. Therefore, phase variations are attributed to the measurement noise. From these variations, the noise can be estimated together with the phase. Certain phase angle of $\phi$ is assumed and then ¢ phase correction applied to the data from the both channels with the phase 90° apart. This phase correction is equivalent to rotating the data of these two channels through an angle of ¢. After rotation, one channel will contain primarily the NMR signal while the other channel will contain primarily noise. The value of the proper $\phi$ is determined as one that minimized noise. Together with the phase angle, the baseline correction or offset (i.e., the value of the detector measurements corresponding to the zero magnetization) is determined in similar manner as one that minimizes value attributed to noise after application of the baseline and phase correction. The noise value determined from the corrected CPMG data may be used in the inversion, as described in greater detail below. The embodiments described herein do not involve modification of the phase rotation and baseline correction algorithms, and assumes that the algorithms established in the industry are used.

The spin echo signal and noise data extracted from the acquisition device are proportional to the magnetization producing the echoes but dependent on the device properties. However, the goal of the measurement is to determine device independent quantities, namely volume shares of different fluids containing magnetic nuclei with their respective T1 and T2 relaxation times. For this purpose, antenna gain correction, temperature correction, and calibration may be performed. Antenna gain correction makes the data independent on the receiver coil antenna properties. Then, temperature correction is done to make the data proportional to the concentration of magnetic nuclei. This can be done because maximum magnetization $M_0$ for the specific magnetic nuclei is proportional to the product of their concentration to the magnitude of the static magnetic field $B_0$ divided by absolute temperature of the object of interest. Since in typical NMR measurement (oil/gas and medical) magnetic nuclei are the same, namely protons—hydrogen nuclei, antenna gain and temperature correction make the signal amplitude proportional to the product of proton concentration and $B_0^2$. Since $B_0$ is a known device property, the proportionality coefficient may be determined by calibration—i.e., by performing NMR measurement for a fluid with hydrogen magnetic nuclei of known volume share, T1 and T2 and then determining proper calibration coefficient to achieve that known porosity. This fluid is typically doped water so the known volume share is 1. Doping is done to reduce T1 and T2 that reduces necessary acquisition time and makes calibration easier and more reliable. The embodiments described herein do not involve modification of the antenna gain correction, temperature correction, and calibration algorithms, and assumes that the algorithms established in the industry are used.

Figure 4:
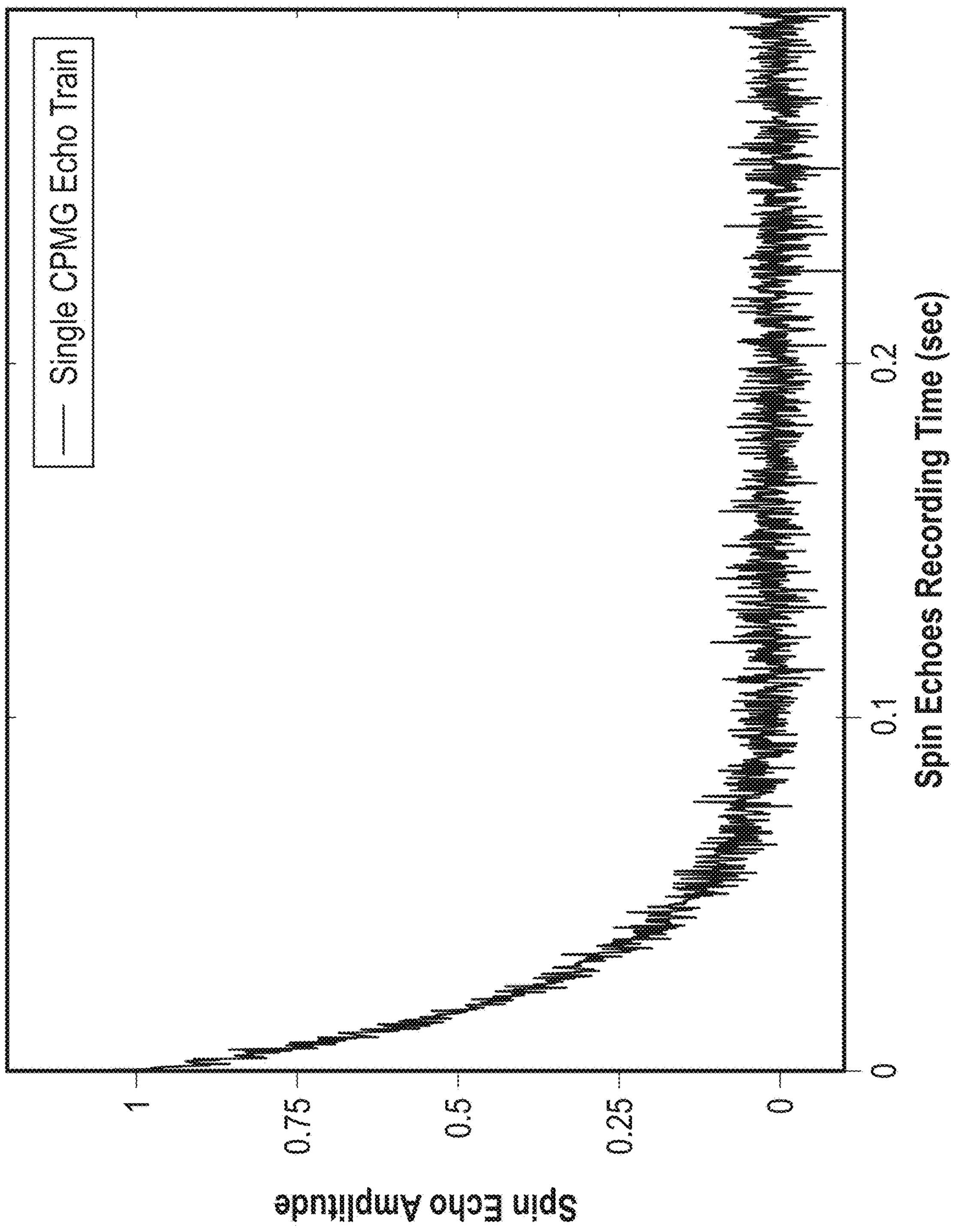
FIG. 4 illustrates a single Carr-Purcell-Meiboom-Gill (CPMG) echo train, in accordance with embodiments of the present disclosure.

FIG. 4 illustrates a single CPMG echo train—i.e., phase rotated, antenna gain and temperature corrected calibrated spin echo amplitude value vs. time. CPMG is recorded in a laboratory for a doped water with 2.0 sec wait time and contains 1800 echoes with spacing time TE=0.2 msec. The doped water is expected to have T1≈T2≈25 msec. Assuming full polarization before the 90° RF pulse and the absence of noise the n-th spin echo amplitude (e.g., that from now on is assumed to be phase rotated, antenna gain and temperature corrected calibrated spin echo amplitude at the moment of time t=n·TE) for a fluid of relative volume P with single T2 relaxation time is given by the equation:

$$E_n = E(t = n \cdot TE) = P \cdot \exp\left(-\frac{n \cdot TE}{T2}\right) \quad (1)$$

Equation (1) assumes that the applied magnetic field is uniform and static (i.e., no time variation) with respect to the sample. Moreover, an NMR sensor coil (e.g., antenna) circuit is assumed to be at resonance with Larmor frequency with zero bandwidth (i.e., antenna Q is assumed to be infinite). Noise $w_n$ is expressed as an additive term to the equation. As a rule, it is considered to be zero mean Gaussian independent on spin echo index n.

$$E_n = P \cdot \exp\left(-\frac{n \cdot TE}{T2}\right) + w_n \quad (2)$$

Figure 5:
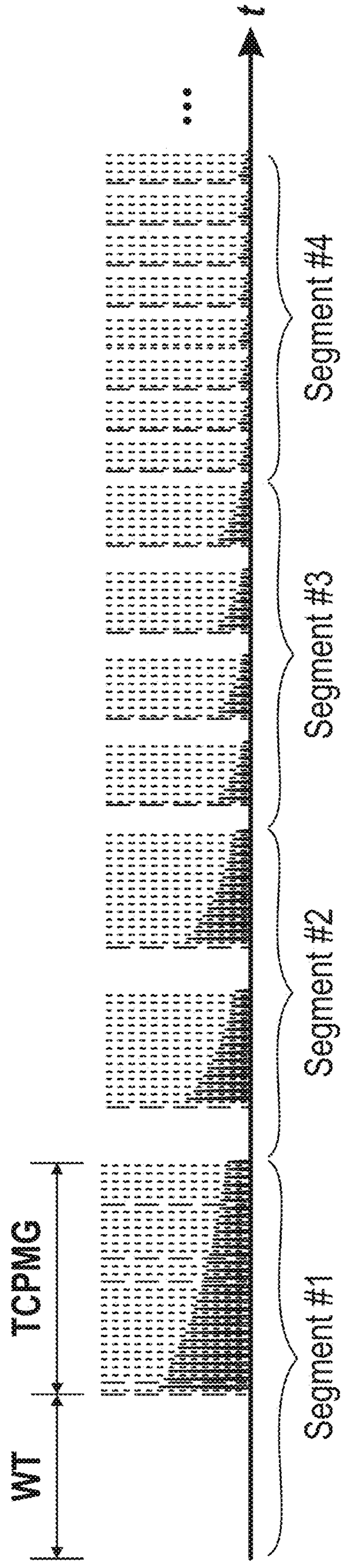
FIG. 5 is a diagram of a typical T1-T2 measurement pulse sequence that consists of multiple CPMGs, in accordance with embodiments of the present disclosure.

FIG. 5 is a diagram of a typical T1-T2 measurement pulse sequence that consists of multiple CPMGs. In order to characterize both T1 and T2 relaxation times of the fluids under investigation, the NMR acquisition sequence is designed to have multiple CPMGs separated by wait time (WT) periods. During a WT period, there are no RF pulses and spin polarization governed by T1 occurs. Such sequence is called a T1-T2 sequence. FIG. 5 shows a typical T1-T2 sequence.

Figure 6:
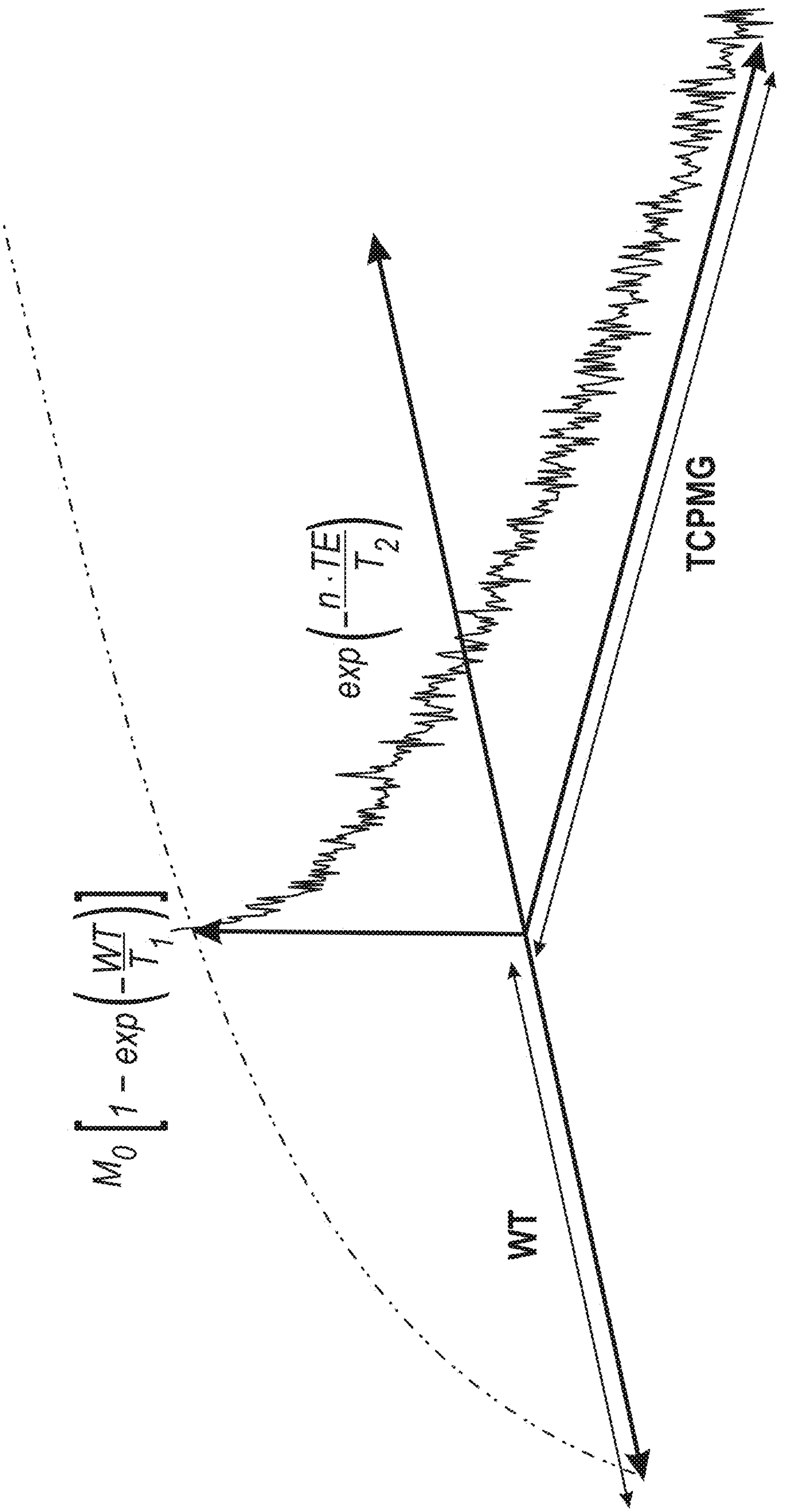
FIG. 6 is a diagram of an NMR signal observed in a typical CPMG of a T1-T2 measurement sequence, in accordance with embodiments of the present disclosure.

FIG. 6 is a diagram of an NMR signal observed in a typical CPMG of a T1-T2 measurement sequence. It consists of a series of CPMG sequences with different WTs, numbers of echoes (NEs), and TEs to cover to a wide range of samples. Each of these sequences involves polarization during a WT period followed by spin echoes observation as shown in FIG. 6. The long echo train with long WTs has sensitivity to long T1-T2 components, but it is often executed only once or a few times due to long execution time. On the other hand, short echo trains with short WTs are often executed multiple times to ensure enough sensitivity to short T1 and short T2. In addition, short echo trains often use short TEs to capture short T2 components that decay quickly.

Moreover, CPMG sets are normally collected in pairs. After acquisition of the first set, the phase of the RF pulses is changed by 180° (not to be confused with the 180° tipping angle) for the second set acquisition. That renders negative spin echoes amplitudes of the same magnitude. The second set is then subtracted from the first set to produce a phase-alternate pair (PAP). This procedure called phase-alternate pulse sequence (PAPS) technique is designed to preserve the signal and eliminate low-frequency electronic offsets.

Series of CPMG sets with the same WT, NE, and TE is called sub-measurement. Assuming that k is the sub-measurement index with a number of sub-measurements being designated as NS, l is the index of CPMG PAP within sub-measurement, r is the index of CPMG within the pair (e.g., it spans just two indices denoting positive or negative CPMG), the n-th (n is again the echo index within CPMG n=1, . . . $NE_k$) spin echo amplitude for a fluid of relative volume P with single T1 and T2 relaxation times is given by the equation:

$$E_{k,l,r,n} = C_{k,l,r} \cdot P\left[1 - \exp\left(-\frac{WT_k}{T1}\right)\right]\exp\left(-\frac{n \cdot TE_k}{T2}\right) + w_n \quad (3)$$

where coefficient $C_{k,l,r}$ is either ½ for a positive CPMG of a PAP or −½ for a negative CPMG. Equation (3) again assumes uniform and static magnetic field and infinite antenna Q.

As a rule, PAPS-ing is performed. That is, negative CPMG echoes of a PAP are subtracted from positive and upon that results for all CPMG of the sub-measurement are summed together with the sum divided to the number of CPMG pairs. Upon PAPS-ing the spin echo amplitude is governed by the equation:

$$E_{k,n} = P\left[1 - \exp\left(-\frac{WT_k}{T1}\right)\right]\exp\left(-\frac{n \cdot TE_k}{T2}\right) + \tilde{w}_{k,n} \quad (4)$$

Noise $\tilde{w}_{k,n}$ expressed in the equation (4) is one specific to the k-th sub-measurement. $\hat{w}_{k,n}$ designates noise realizations for the k-th sub-measurement, with noise magnitude denoted as $|\tilde{w}|_k$. Commonly, CPMGs with shorter WT and less NE designed to gather information on T1 employ more PAPs and, therefore, noise magnitude for them is reduced by PAPS-ing. Consequently, noise magnitude is estimated on per sub-measurement basis.

In cases when NMR depth logging is performed, reduction of noise can be done by summing several echo trains obtained at the adjacent depth and dividing the sum to the number of depths. This procedure is called stacking. In addition, parts of the acquisition sequence can be recorded at the adjacent depths in order to speed logging. Typically, one set of the longest first CPMG and half CPMG pairs of all other sub-measurements is acquired, and then at the next depth phase-alternate set of the longest CPMG with another half of CPMG pairs is acquired. Sequences acquired at adjacent depth is then merged, PAPS-ed and stacked. The embodiments described herein do not involve modification T1-T2 sequence acquisition techniques and PAPS-ing including relevant modifications of the phase-rotation, noise evaluation, antenna gain correction, temperature correction and calibration algorithms. Rather, the embodiments described herein assume that the algorithms established in the industry are used. However, the embodiments described herein do involve modification of stacking algorithms in the manner discussed below, namely using different number of stacked depths for different sub-measurements and CPMG segments.

Thus, the spin echoes for a fluid with single T1 and T2 relaxation times with uniform and static magnetic field and infinite antenna Q is governed by the equation (4). Various inversion techniques such as Tikhonov regularization, rigorous Bayesian inference methods, and heuristic stochastics methods use that relationship to deliver the fluid volume distribution P (T1, T2) with respect to the relaxation times that corresponds to the observed echoes amplitudes $E_{k,n}$ and sub-measurement noise of the magnitude $\tilde{w}_k$. The multiplicative term that renders echoes amplitudes (or their window sums) from the fluid volume for specific relaxation times P(T1,T2) is called NMR kernel. The NMR kernel for individual echoes corresponding to the equation (4) is:

$$K_{k,n}(T1, T2) = \left[1 - \exp\left(-\frac{WT_k}{T1}\right)\right]\exp\left(-\frac{n \cdot TE_k}{T2}\right) \quad (5)$$

The embodiments described herein do not involve modification of the inversion algorithms per se once the observed echoes amplitudes and sub-measurement noise are established. However, it involves modifications with regards to the echo amplitudes and noise due to variability in the number of stacking depths.

Customarily, to compress the data and enhance performance, an inversion is performed with linear combinations of the spin echoes $E_{k,n}$ rather than with individual echoes. One of such methods is to use predetermined window sums, alternatively linear combinations are determined from the properties of the kernel itself with respect to relaxation time values (e.g., with singular values decomposition). NMR kernels for the linear combinations of the spin echoes are computed as respective linear combinations of the individual echoes NMR kernels.

Effect of Deviations from the Ideal Conditions on the NMR Kernel

However, while NMR kernel (5) assumes uniform and static magnetic field and infinite antenna Q, none of that is true and deviation from these ideal conditions affect observed spin echoes amplitudes. One well known factor is drastic deviation of the amplitude of the several echoes in the beginning of CPMG due magnetic field inhomogeneity and another is deviation of the T1 dependent polarization term in equation (5) due to movement of the sample in inhomogeneous magnetic field. In the presence of these effects, the NMR kernel is expressed as follows:

$$K_{k,n}(T1, T2) = D_n \cdot Pol(WT_k, T1, CS) \cdot \exp\left(-\frac{n \cdot TE_k}{T2}\right) \quad (6)$$

$$Pol(WT_k, T1, CS) = SP(WT_k, CS)\left[1 - \exp\left(-\frac{WT_k}{T1}\right)\right] + [1 - SP(WT_k, CS)]PP(T1, CS)$$

where $D_n$ is a spin dynamics coefficient that is equal to 1 for all but several (typically up to 3) echoes in the beginning and Pol($WT_k$, T1, CS), SP($WT_k$, CS), and PP(T1, CS) are respectively a polarization function, a spoiling factor, and a pre-polarization factor that depend on the tool design, logging direction and logging velocity CS. They are determined through tool virtual prototyping with numeric modeling validated by laboratory experiments.

Figure 7:
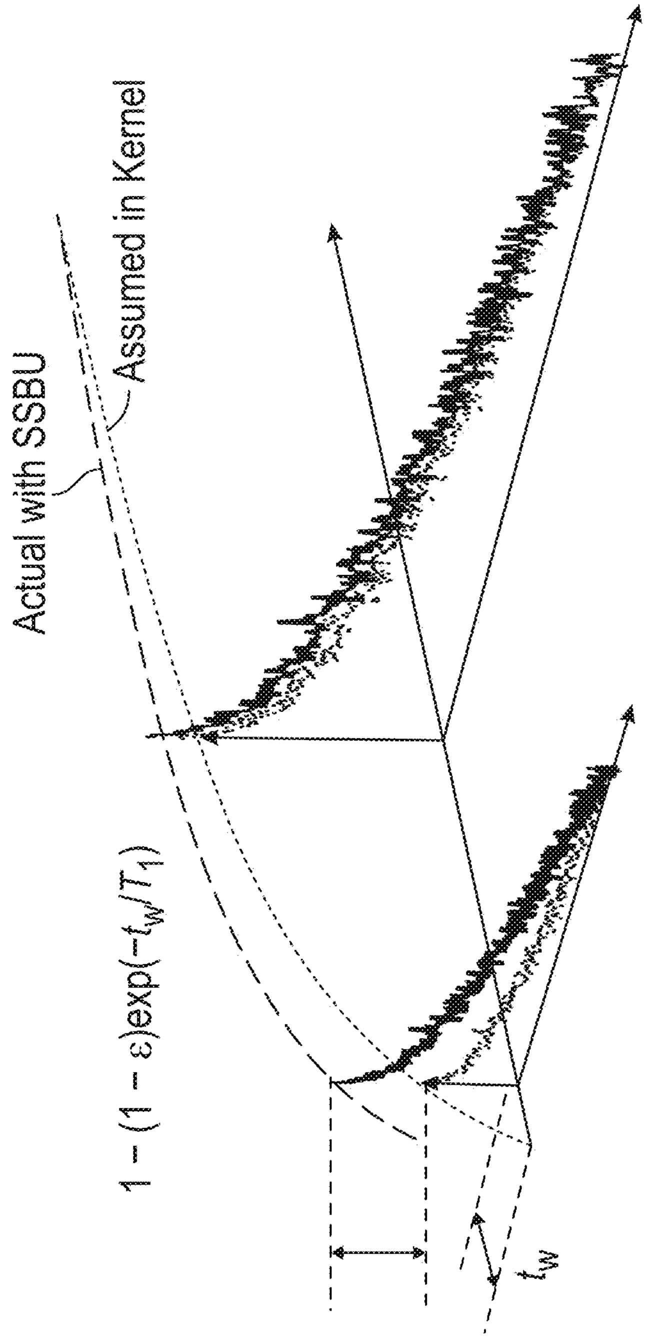
FIG. 7 illustrates the steady state build-up (SSBU) effect on spin echo amplitudes, in accordance with embodiments of the present disclosure.

FIG. 7 illustrates the steady state build-up (SSBU) effect on spin echo amplitudes ($t_w$ is the wait time). There exists an additional contribution to the observed NMR signal coming from the off-resonance spins in inhomogeneous magnetic field that manifests itself as increased polarization of the spins with respect to the equation (5) as demonstrated in FIG. 7. This effect called steady state build-up (SSBU) is especially significant for short WT and NE sub-measurements in the T1-T2 sequence.

At resonance (i.e., $\omega_0/\omega_1=0$), longitudinal magnetization is zero, which then recover to the thermal equilibrium during wait time (WT) by following equation (3), as schematically represented by a blue curve in FIG. 6. However, off-resonance spins have non-zero longitudinal magnetization, whose amplitude and sign depend on the amount of frequency offset, as well as sample properties (T1 and T2) and measurement parameters (WT, NE and TE). As a result, the net magnetization (i.e., the sum over a given frequency range) can be positive as shown in FIG. 7. The amount of deviation from what equation (3) expects (i.e., the difference between blue solid line and blue dashed line in FIG. 7) depends on the signal bandwidth in addition to the sample/measurement parameters.

The signal bandwidth that is inversely proportional to the antenna Q varies in well logging operation. For example, in high-temperature and/or high-salinity environment, the effective coil resistance R increases, hence Q decreases. Therefore, both T1 and T2 measurements are affected by the pulse sequence as well as the tool properties that are affected by the environment. To accommodate effects described NMR kernel is modified as follows:

$$K_{k,l,r,n}(T1, T2, Q) = C_{k,l,r} \cdot R_{k,l,r}(T1, T2, Q) \cdot D_{k,l,r,n} \cdot Pol_{k,l,r}(WT_k, T1, CS) \cdot \exp\left(-\frac{n \cdot TE_k}{T2E_{k,l,r}(T1, T2, Q)}\right) \quad (10)$$

In this equation, k is the sub-measurement index, l is the index of CPMG PAP within sub-measurement, r is the index of CPMG within the pair (it spans just 2 indices denoting positive or negative CPMG), n is the echo index within CPMG n=1, . . . $NE_k$, coefficient $C_{k,l,r}$ is either ½ for a positive CPMG of a PAP or −½ for negative, $D_{k,l,r,n}$ and $Pol_{k,l,r}$ ($WT_k$, T1, CS) respectively denote spin dynamics coefficient and polarization function as described in the equation (6); however, with assumption of them to be different for each individual CPMG in the sequence. The sub-measurement amplitude ratio $R_{k,l,r}$ (T1, T2, Q) and effective spin-spin relaxation time $T2E_{k,l,r}$ (T1, T2, Q) as functions of relaxation times T1, T2 and antenna quality Q are introduced to account for SSBU and antenna quality effects described above.

Functions $R_{k,l,r}$(T1, T2, Q) and $T2E_{k,l,r}$(T1, T2, Q) are determined numerically with validation via laboratory data. A variety of numerical results has demonstrated that spin dynamics coefficient, polarization function, sub-measurement amplitude ratio and effective T2 or any subset of them may be treated as identical within CPMG PAP or within all CPMGs of a sub-measurement or even within entire acquisition sequence. However, as laboratory data and numerical results for the tool virtual prototype described below suggest, sub-measurement amplitude ratio must be sub-measurement dependent, while the other three coefficients can be treated as identical within the acquisition sequence. As observed, numerical and laboratory accuracy so far does warrant for sub-measurement distinction only for the sub-measurement amplitude ratio. However, if that accuracy increases in the future (as expected), individual CPMG differences as denoted in the equation (10) are to be considered as well. Assuming identity described above corrected NMR kernel for PAPS-ed echoes is described as follows:

$$K_{k,n}(T1, T2, Q) = R_k(T1, T2, Q) \cdot D_n \cdot Pol(WT_k, T1, CS) \cdot \exp\left(-\frac{n \cdot TE_k}{T2E(T1, T2, Q)}\right) \quad (11)$$

Various inversion techniques described above work for any inversion kernel including ones described by equations (5), (6), (11), or (10) as soon as the observed echoes amplitudes and corresponding noise magnitudes are determined.

(1) Tikhonov Regularization Used in an NMR Inversion and Resultant Bias

Introduction

Accuracy and precision of the inverted T1-T2 maps directly impact all subsequent analyses and, therefore, they are very important for formation evaluation. The measurement sensitivity can vary significantly with variation of T1 and T2. With acceptable sensitivity for most T1 and T2, it can become unacceptably low for certain areas such as low T2. Low sensitivity leads to a loss of precision. To compensate for this loss, regularization is used in the course of NMR measurements inversion with Tikhonov regularization being the most preferred technique. However, Tikhonov regularization introduces bias into inverted T1-T2 maps. As demonstrated below, this bias can be especially significant in the areas are of special interest for formation evaluation. Therefore, correcting this bias without reduction in precision is a matter of great importance. The embodiments described in this section introduce a new technique to perform such correction. Conventional techniques have generally been divided into two categories:

- Methods to improve forward model accuracy (i.e., methods to produce more accurate NMR echo train approximation given T1-T2 of the fluid components).
- Methods to improve inversion accuracy and precision in which forward modeling aspect is considered to be known and not discussed.

In general, the embodiments described in this section fall into the second category; however, they apply post-processing of the inverted T1-T2 maps produced by inversion methods that apply Tikhonov regularization.

Summary of the Tikhonov Regularization Used in an NMR Inversion and Resultant Bias In general, the embodiments described in this section improve accuracy of the inverted T1-T2 maps without reduction of precision by correcting for the bias caused by Tikhonov regularization. This improvement is done in the following manner:

- Computational model, also known as a virtual prototype, is built for the NMR tool in consideration in order to model NMR echo trains for the tool. Depending on the desired accuracy, the virtual prototype could be elaborated taking into account effects of NMR spin dynamics and the variation of the tool's operating conditions or simplified that omits or just roughly approximates all or some of the mentioned effects.
- Virtual prototyping is performed on typical NMR acquisition sequences with a set of T1-T2 sources that covers well T1-T2 pairs representative for the inversion.
- Then, Monte-Carlo simulation is performed. Synthetic echo traces are made on the base of the virtual prototyping results by addition of independent Gaussian noise of the magnitude representing acquisition conditions. A number of the synthetics echo traces must be sufficient for Monte-Carlo evaluation of the bias. Values of the fluid volume and of the noise magnitude of the synthetics echo traces must cover a range that is representative enough to collect bias estimation data in a manner described below.
- Subsequently, NMR inversion that applies Tikhonov regularization is used to invert fluid volumes from the synthetic data described above. Inversion is performed using a representative range of regularization parameters. Bias is estimated as a difference between the input fluid volume of the synthetic data and the average of total NMR porosity inversion results of the synthetic data subset that corresponds to the specific values of T1, T2, input fluid volume, noise magnitudes, regularization parameters and specific tool's operating conditions for the virtual prototype. Bias is treated as a function of the values that specify the subset mentioned above. This function for the argument values not equal to ones for any of the synthetic data samples is estimated using established interpolation-extrapolation methods. The function is inversion algorithm specific and bias estimation as described above must be redone if the algorithm changes. Apparently, a correction function is also specific to the tool model and acquisition sequence.
- When NMR inversion is performed for field data, inverted T1-T2 maps are subsequently corrected for bias using function determined above. Bias is corrected on per T1-T2 basis using values of regularization parameters of the inversion and values of noise magnitudes and tool's operating parameters for the field data.

One novelty of the embodiments described in this section is the determination of the bias function through Monte-Carlo simulation including a method to reduce dimensionality of the bias function described below.

Details of the Tikhonov Regularization Used in an NMR Inversion and Resultant Bias A common type of T1-T2 inversion type used in the industry is based on discretized T1-T2 pairs. Commonly, T1 and T2 values form a certain rectangular grid that is uniform on a logarithmic scale. The grid is set in a T1-T2 area for which sufficient sensitivity is provided by the acquisition sequence. To improve robustness, some subset of the grid may be excluded from an inversion (i.e., fluid volume value for T1-T2 from the subset is set to zero). As a rule, excluded T1-T2 values are the ones that are not observed in the investigated rocks and/or ones for which the downhole logging tool 12 has practically no sensitivity. An index j may be used for discretized T1-T2 pairs. The index spans through both T1 and T2 covering the entire rectangular grid without the excluded subset. The inversion seeks for the values of $P_j$-fluid volumes corresponding to the pairs of $T1_j$ and $T2_j$. If the inversion deals with PAPS-ed echo trains (which is most commonly the case), then it seeks for $P_j$ minimizing the misfit between observed echoes amplitudes $E_{k,n}$ and restored ones:

$$\sum_{j=1}^{NT} K_{k,n}(T1_j, T2_j)\cdot P_j \tag{12}$$

NT in this equation designates the number of discretized T1-T2 pairs. The NMR kernel can be one corresponding to the equations (5), (6) or (11) depending on the degree of forward modeling accuracy. Values of $P_j$ found by the inversion with 0 values added for excluded subset of T1-T2 pairs constitute an inverted T1-T2 map. As a rule, the inversion does not minimize misfit per se, but misfit with an additional term proportional to the Euclidean norm of the fluid volumes vector $\|P\|$. This method is called Tikhonov regularization, which is described in greater detail herein. This inversion deals with echoes amplitudes compressed using window sums technique. Compressed echoes amplitudes are normalized by the expected noise for these amplitudes so that expected magnitude of noise would be 1. Such normalization can also be used for other methods of compression and for uncompressed amplitudes. Namely observed compressed amplitudes are given by:

$$\mathcal{E}_{k,m} = \frac{1}{|\tilde{w}|_k \cdot \sqrt{\mathcal{L}_{k,m}}} \sum_{n=\mathcal{S}_{k,m}}^{\mathcal{S}_{k,m}+\mathcal{L}_{k,m}-1} E_{k,n} \tag{13}$$

Here m=1, . . . $\mathcal{N}$ is a window index, $\mathcal{S}_{k,m}$ is echo index corresponding to the start of m-th window in k-th sub-measurement and $\mathcal{L}_{k,m}$ is the length of the window. Restored compressed amplitudes are given by:

$$\sum_{j=1}^{NT} \mathcal{K}_{k,m,j} \cdot P_j \tag{14}$$

with kernel for compressed echoes given by:

$$\mathcal{K}_{k,m,j} = \frac{1}{|\tilde{w}|_k \cdot \sqrt{\mathcal{L}_{k,m}}} \sum_{n=\mathcal{S}_{k,m}}^{\mathcal{S}_{k,m}+\mathcal{L}_{k,m}-1} K_{k,n}(T1_j, T2_j) \tag{15}$$

Tikhonov regularization for the inversion is implemented as constrained minimization:

$$\sum_{i=1}^{NT} \sum_{j=1}^{NT} (\mathcal{A}_{ij} \cdot P_j - \mathcal{b}_j)^2 \to \min|0 \le P_j \le 1,\ j = 1, \ldots NT \tag{16}$$

where matrix $\mathcal{A}_{ij}$ is defined as:

$$\mathcal{A}_{ij} = \sum_{k=1}^{NS} \sum_{m=1}^{N_k} \mathcal{K}_{k,m,i} \cdot \mathcal{K}_{k,m,j} + \delta_{ij} \cdot \sum_{k=1}^{NS} \alpha_k, \quad i = 1, \ldots NT,\ j = 1, \ldots NT \tag{17}$$

and vector $\mathcal{b}_j$ as:

$$\mathcal{b}_j = \sum_{k=1}^{NS} \sum_{m=1}^{N_k} \mathcal{K}_{k,m,j} \cdot \mathcal{E}_{k,m},\ j = 1, \ldots NT \tag{18}$$

$\alpha_k$ are per sub-measurement regularization parameters. Although, eventually, they are used in the inversion only as the sum for all sub-measurements, it makes sense to specify them separately. The reason is that, as a rule, the regularization parameter value should be defined based on the properties of the kernel matrix and signal-to-noise ratio (SNR) of the measurement (as for one of common techniques-generalized cross-validation). Different sub-measurements may differ significantly in terms of kernel properties and SNR; hence, it is useful to determine proper regularization parameters for each of them.

Regularization parameters may be defined ad hoc algorithmically based on the properties of the kernel and SNR. As a rule, regularization should be reduced with an increase of the SNR and a decrease of span of the singular values of the kernel. The following algorithmic process was designed to determine regularization parameter employing the generalized cross-validation approach. Matrix $\boldsymbol{\mathcal{K}}_k$ may be considered the kernel $\mathcal{K}_{k,m,j}$, m=1, . . . $\mathcal{N}_k$, j=1, . . . NT. Singular values of the matrix $\boldsymbol{\mathcal{K}}_k$ may be denoted as sorted in descendant order as $s_{k,p}|s_{k,p} \ge s_{k,p+1}$ (indexing start with 1, so $s_{k,1}$ is the maximum singular value). We denote minimum index of singular values that are less of equal to 1 as $\acute{p}_k$. Then, the regularization parameter is given by:

$$\alpha_k = s_{k,1} \cdot s_{k,\acute{p}_k} + \Delta p \sqrt{\frac{N_k}{\sum_{m=1}^{N_k} \mathcal{E}_{k,m} \cdot \mathcal{E}_{k,m}}} \quad \acute{p}_k = \min(p|s_{k,p} \le 1) \tag{19}$$

Δp in equation (19) is a small non-negative integer (commonly 0 or 1) used to adjust regularization. 0 renders greater regularization parameter value than 1. A non-zero value of the regularization parameters leads to a bias in inverted T1-T2 maps. Here, this bias is estimated numerically for the inversion.

Figure 8:
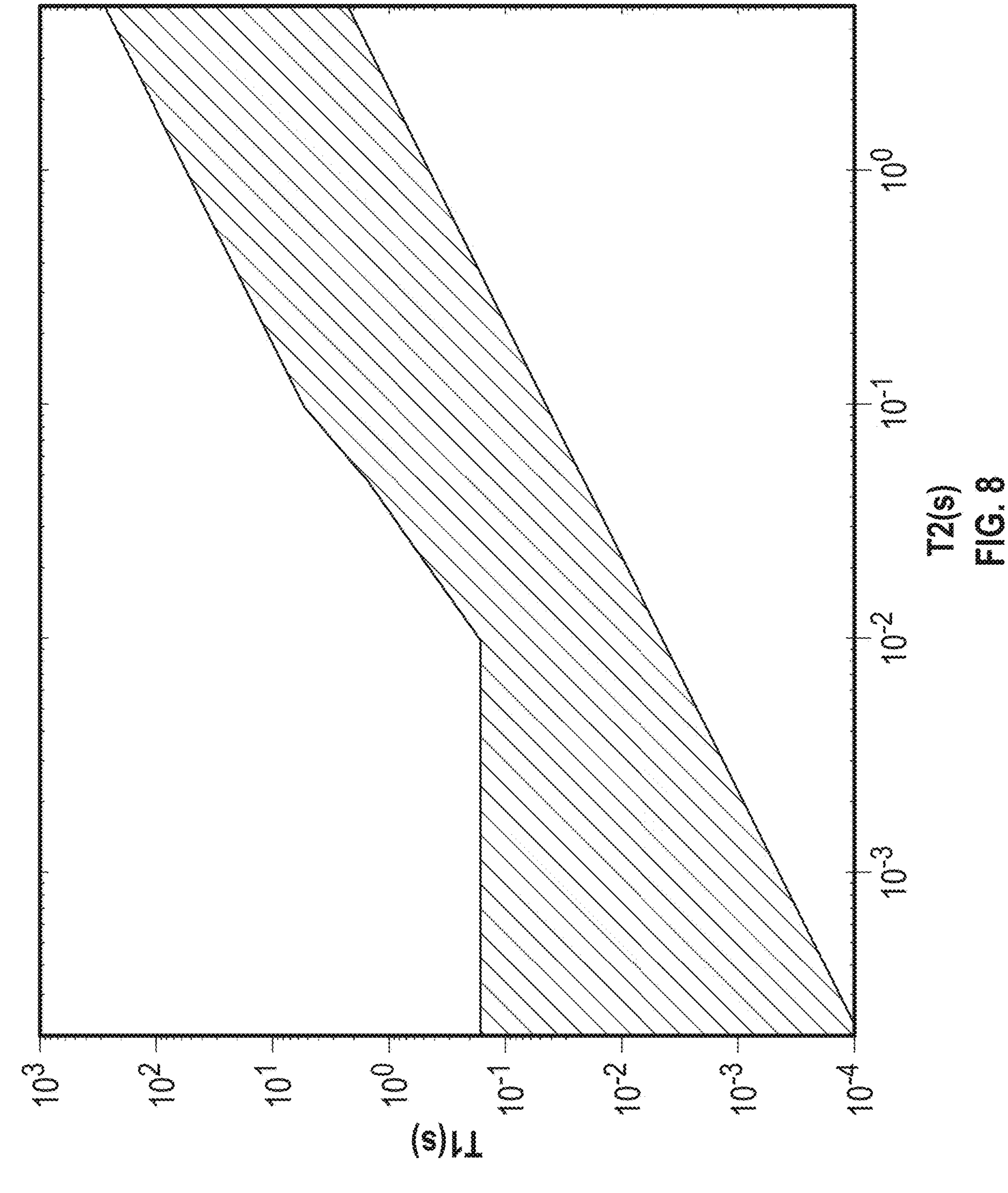
FIG. 8 shows a T1-T2 area spanned in an inversion, in accordance with embodiments of the present disclosure.

Table 1 describes the T1-T2 acquisition sequence used for the inversion. Table 2 lists the lengths of the windows used for echo compression. FIG. 8 shows the T1-T2 area spanned in the inversion (white areas correspond to the excluded subset, and the blue areas designate the T1-T2 area spanned in the inversion for which bias is estimated).

TABLE 1

Properties of the T1-T2 acquisition sequence used for the inversion bias estimation.

| Sub-measurements | SM1 | SM2 | SM3 | SM4 | SM5 | SM6 |
|---|---|---|---|---|---|---|
| NE | 1800 | 600 | 100 | 50 | 20 | 20 |
| Number of CPMG PAPs | 1 | 2 | 10 | 30 | 50 | 50 |
| TE (us) | 200 | 200 | 200 | 200 | 280 | 280 |
| WT (s) | 2 | 0.3 | 0.05 | 0.01 | 0.003 | 0.0012 |

TABLE 2

Window lengths used for compression in the inversion for which bias is estimated.

| Sub-measurements | Window lengths |
|---|---|
| SM1 | 1, 1, 1, 1, 1, 1, 42, 112, 320, 480, 840 |
| SM2 | 1, 1, 1, 1, 1, 1, 42, 112, 160, 280 |
| SM3 | 1, 1, 1, 1, 1, 1, 42, 52 |
| SM4 | 1, 1, 1, 1, 1, 1, 44 |
| SM5 | 1, 1, 1, 1, 1, 1, 14 |
| SM6 | 1, 1, 1, 1, 1, 1, 14 |

Monte-Carlo simulation is carried out. The T1 and T2 representative values are chosen to form 16·16 rectangular grid uniform on a logarithmic scale for T1 in range [1 msec, 3000 msec] and T2 in range [0.5 msec, 3000 msec]. Relaxation times corresponding to the white areas of FIG. 8 are excluded. Synthetic echo traces are made for these T1-T2 pairs on the basis of the virtual prototyping of CMR-Plus tool that accounts for SSBU and antenna Q=60 with static magnetic field. Fluid volume is set to 0.1 and independent Gaussian noise of the constant magnitude is added to the un-PAPS-ed echo trains. Then, PAPS-ing is done. The noise magnitude for un-PAPS-ed echoes is chosen to achieve 0.02 per echo noise magnitude for SM1. 300 synthetics echo traces are generated for each T1-T2 pair. The only difference for these traces is noise realization. The number 300 was chosen because inversion bias value as estimated below does not change more than 1% when estimated for 400 traces.

Subsequently, the inversion described above is performed with T1 in range [1 msec, 3000 msec] and T2 in range [0.5 msec, 3000 msec]. The regularization parameter is set according to the equation (19). Two sets of the inversion parameters are used. First uses 16.16 grid for T1-T2 discretization with Δp=0. These parameters are called standard regularization parameters. Parameters of the second set that uses a 32.32 T1-T2 grid with Δp=1 called low regularization parameters. Bias is estimated as difference between average of the total NMR porosity for 300 traces and input fluid volume value 0.1.

Figure 9:
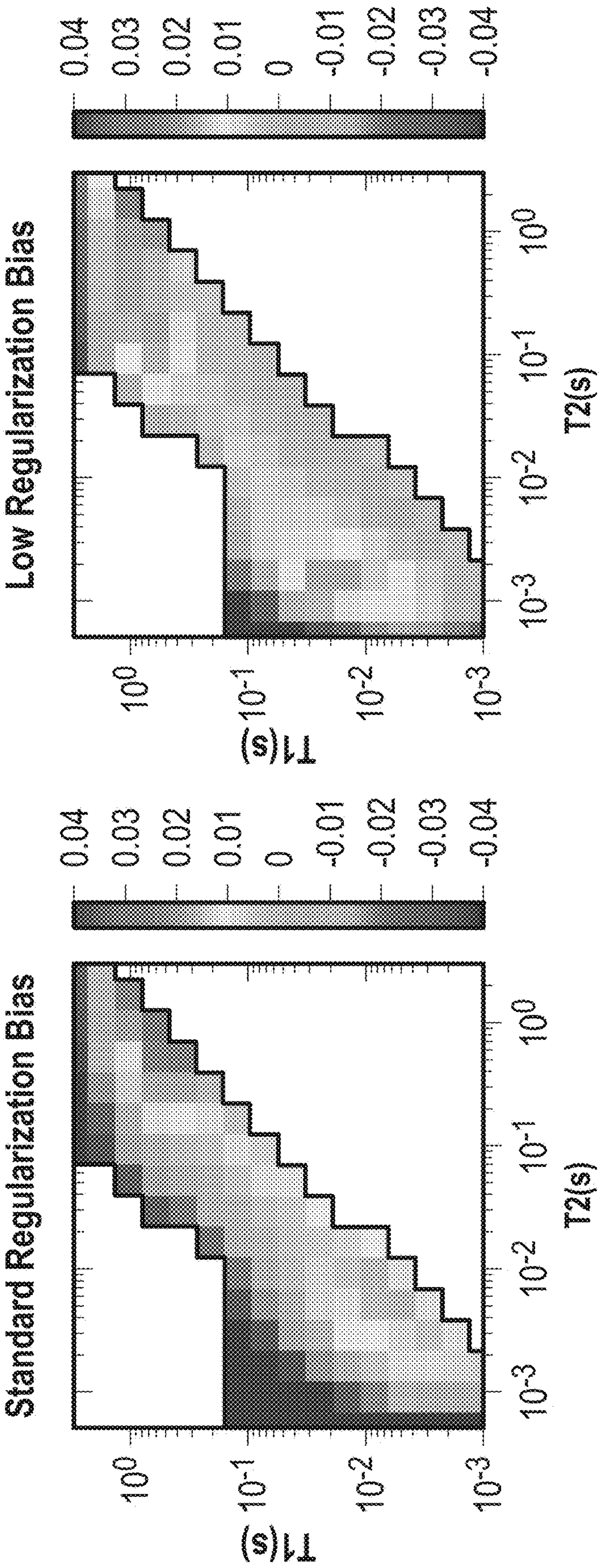
FIG. 9 demonstrates the results of s bias estimation for standard and low regularization, in accordance with embodiments of the present disclosure.

FIG. 9 demonstrates the results of the bias estimation for standard and low regularization. It is obvious that the bias is positive (i.e., porosity overcall) for T1-T2 areas that are not on the boundaries of inversion T1-T2 range. The bias can reach 0.04 that is 40% of the true value. This is a relatively significant overcall. Also, it can be noted there are areas in which low regularization bias exceeds one with standard regularization, although overall bias is lower for low regularization. The numerically median value of the bias with boundary areas are excluded from consideration is 0.0059 for low regularization vs. 0.0081 for standard. Unfortunately, these distinctive high overcall areas are one of low T2 with high T1/T2 ratio and another with high T2. These areas are especially important for formation evaluation because they are particular areas of interest. The first one corresponds to unconventional reservoirs and second one corresponds to large size pores in carbonates. Such bias disqualifies low regularization inversion that is capable to improve maps resolution. It should be noted that this result is specific for the case of SSBU taken into account. Similar analysis without SSBU shows that low regularization bias is uniformly lower than one for standard regularization. Therefore, the analysis demonstrates the necessity of correction for the bias caused by Tikhonov regularization.

Generic Procedure for Bias Correction

A bias correction procedure is proposed that capitalizes on the estimation technique described above. The computational model (i.e., virtual prototype) is built for the NMR tool in consideration in order to model NMR echo trains for the tool. Depending on the desired accuracy, the virtual prototype could be an elaborated one taking into account effects of NMR spin dynamics and the variation of tool's operating condition or simplified as in equations that omit or just roughly approximate all or some of the mentioned effects (see equations (11), (6) or (5)). Virtual prototyping is performed on typical NMR acquisition sequences with a set of T1-T2 sources that covers well T1-T2 pairs representative for the inversion.

Subsequently, Monte-Carlo simulation is performed. Synthetic echo traces are made on the base of the virtual prototyping results by addition of independent Gaussian noise of the magnitude representing acquisition conditions. The number of the synthetics echo traces with the same T1, T2, input fluid volume noise magnitudes and the specific tool's operating conditions for the virtual prototype must be sufficient for Monte-Carlo evaluation of the bias. Sufficient here means that further increase of the number of the synthetics echo traces does not result in significant changes of the bias estimates. Values of the fluid volume and of the noise magnitude of the synthetics echo traces must cover a range that is representative enough to collect bias estimation data.

Afterwards, NMR inversion of interest that applies Tikhonov is used to invert fluid volumes from the synthetic data described above. Inversion is performed using a representative range of regularization parameters. Bias as estimated as a difference between the input fluid volume of the synthetic data and the average of total NMR porosity inversion results of the synthetic data subset that corresponds to the specific values of T1, T2, input fluid volume, noise magnitudes, regularization parameters and specific tool's operating conditions for the virtual prototype. Bias is treated as a function of the values that specify the subset mentioned above. This function for the argument values not equal to ones for any of the synthetic data samples is estimated using one of the established interpolation-extrapolation methods. For example, local linear regression or radial based functions methods can be used. The function is inversion algorithm specific and bias estimation as described above must be redone if the algorithm changes. Apparently, the correction function is also specific to the tool model and acquisition sequence.

When NMR inversion is performed for field data, inverted T1-T2 maps are subsequently corrected for bias using function determined above. Bias is corrected on a per T1-T2 basis using values of regularization parameters of the inversion and values of noise magnitudes and tool's operating parameters for the field data.

Reduction of the Dimensionality of the Bias Correction Function

The bias correction function designed in a manner described above has too many arguments. Because of this dimensionality curse, it can be relatively time consuming to compute and even apply. Thus, the proposed bias correction procedure may become impractical. However, there are ways to reduce this dimensionality.

First, noise magnitudes per sub-measurement are not independent. Rather, as a rule, noise magnitudes for un-PAPS-ed echo amplitudes are practically identical. Therefore, PAPS-ed echoes noise magnitude for a sub-measurement is inversely proportional to the square root of the sub-measurement CPMG PAPs number (a.k.a., number of repeats). Taking into account this fact allows for derivation of noise magnitudes for all sub-measurements from the first sub-measurement noise magnitude and, thus, reduces the dimensionality.

Another way to reduce the dimensionality is to utilize algorithmic procedures of determining Tikhonov regularization parameters (a.k.a., automatic regularization) that are often utilized by inversions. Thus, spanning through possible regularization parameters values is not necessary and dimensionality is reduced by using just a small number of the inversion parameter sets like standard and low regularization described above.

Moreover, if the regularization parameter is decreasing with SNR increase, it can be expected that the bias function can be determined just for one value of fluid volume and noise. This is actually the case for the described above for the inversion used per equation (19). For a given value of T1 and T2 and antenna Q, the bias function can reduced just to constant bias ratio determined for fluid volume of 0.1 and noise magnitude per echo of 0.02 for SM1. Monte-Carlo simulations for randomly picked points within the range of fluid volumes 0.05-0.35 and SM1 noise magnitudes per echo of 0.01-0.03 (these values being well representing field data) demonstrate that bias (not the inverted porosity) calculated with the simulation does not differ more than 5% from the one determined by multiplication of the input fluid volume to the bias ratio for 0.1 volume and 0.02 noise.

Figure 10:
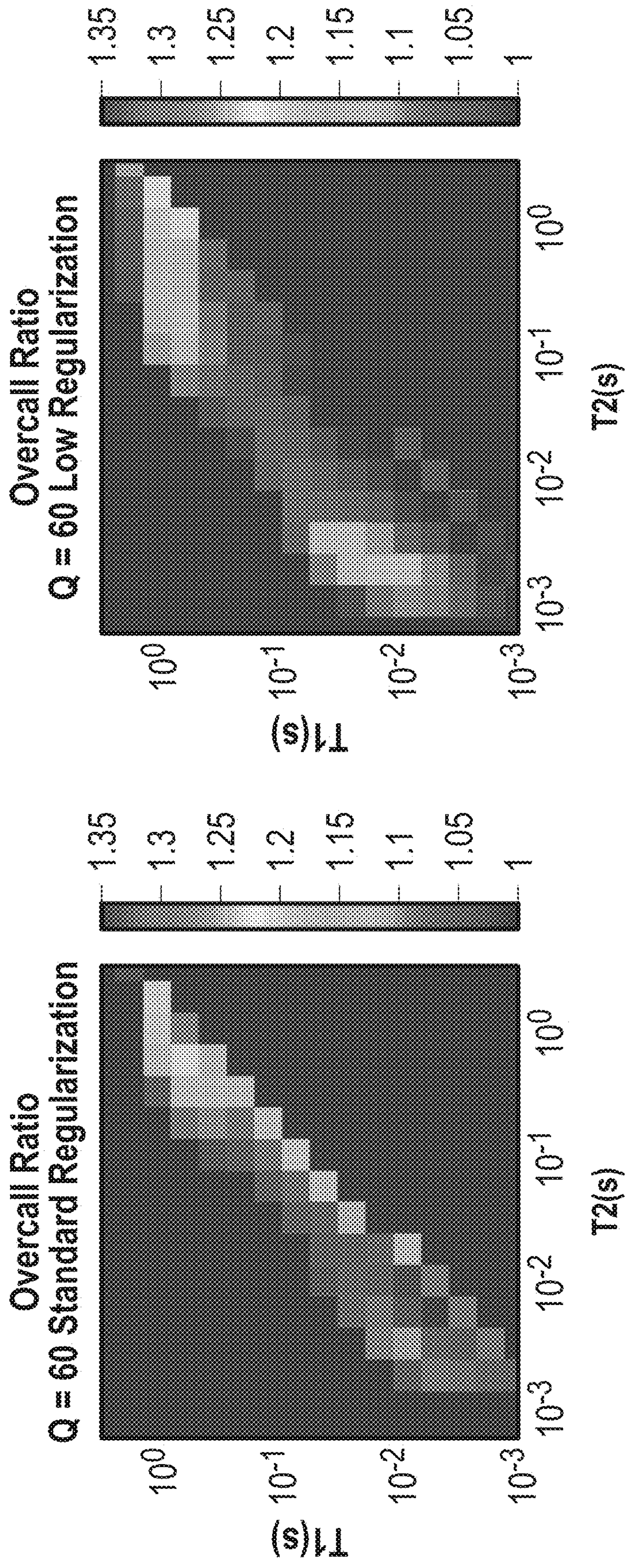
FIG. 10 illustrates overcall ratios for standard and low regularization for inversion with the kernel adjusted to account for SSBU and antenna Q, in accordance with embodiments of the present disclosure.

Thus, in this case, bias function dimensionality can be reduced just to T1, T2 and antenna Q for two sets of the inversion parameters-standard and low regularization. FIG. 10 demonstrates such function in terms of overcall ratio for Q=60. In particular, FIG. 10 illustrates overcall ratios for standard and low regularization for inversion with the kernel adjusted to account for SSBU and antenna Q. The minimum overcall ratio is set to 1. Value of 1 is applied to the T1-T2 pairs excluded from the inversion (e.g., the white areas in FIG. 8). Additionally, the value of 1 is applied to the areas close to be boundaries of the T1-T2 range used in the inversion. The decision not to correct for the under-call in these areas is made because such under-call is caused by the lack of inversion sensitivity rather than Tikhonov regularization. The overcall ratio is estimated through the Monte-Carlo simulation described above for T1-T2 pairs on 16.16 logarithmically spaced rectangular unform grid for T1 in range [1 msec, 3000 msec] and T2 in range [0.5 msec, 3000 msec] as well as for Q of 40, 60 and 80. The overcall ratio beyond three·16·16 sampling points is determined with interpolation and extrapolation. It is performed linearly for logarithms of the ratio with respect to antenna Q and logarithms of T1 and T2. Inverted NMR T1-T2 map values are corrected by dividing to that interpolated ratio.

Applicability to Data Acquired by Other Tools, Pulse Sequences, and Inversions

The embodiments described in this section use the example of NMR T1-T2 logging. However, the embodiments described in this section apply equally to data acquired by any NMR logging tool processed by any inversion applying Tikhonov regularization. In particular, they apply equally regardless of the dimensionality of the output. For example, they apply to one dimensional T2, T1 or diffusion measurement and inversion schemes, to two dimensional T1 and diffusion (or T2 and diffusion) measurement and inversion schemes, and to three dimensional T1, T2, and diffusion measurement and inversion schemes.

(2) Variable Depth Averaging of NMR Two-Dimensional (2D) Maps on Per T1-T2 Basis Introduction Accuracy and precision of the inverted T1-T2 maps directly impact all subsequent analyses and, therefore, they are very important for formation evaluation. However, because of variation of the measurement sensitivity with variation of T1 and T2, the precision of the inverted maps can vary significantly. With acceptable precision for areas of reasonable sensitivity, it can become unacceptably low for certain areas such as low T2. It is important to point out that these areas are of special interest for unconventional formations evaluation. The embodiments described in this section improve precision of the inverted T1-T2 maps for T1 and T2 values where the measurement sensitivity is low. Conventional techniques have generally been divided into two categories:

- Methods to improve forward model accuracy (i.e., methods to produce more accurate NMR echo train approximation given T1-T2 of the fluid components).
- Methods to improve inversion accuracy and precision in which forward modeling aspect is considered to be known and not discussed.

In general, the embodiments described in this section fall into the second category; however, it is not a specific inversion algorithm rather than an extension of any inversion technique. Namely, it is either the method of post-processing inversion results or the method of pre-processing inversion inputs. As such, it can be used with any inversion method such as Tikhonov regularization, rigorous Bayesian inference methods, and heuristic stochastics methods.

Summary of the Variable Depth Averaging of NMR Two-Dimensional (2D) Maps on Per T1-T2 Basis In general, the embodiments described in this section improve precision of the inverted T1-T2 maps for T1 and T2 values where the measurement sensitivity is low. This improvement is done by one of two techniques:

- The post-processing method in which inversion is performed by one of the methods known in the industry for a certain depth interval. Then, the maps are depth stacked; however, the number of stacked depths differs depending on T1 and/or T2. The T1-T2 dependency of the number of the stacked depths is chosen based on stacking results of the inversion of synthetic data.
- The pre-processing method in which NMR echo trains (described herein) are acquired for a certain depth interval. Then, these echo trains are stacked; however, the number of stacked depths differs depending on the sub-measurements and the echo train segment. This dependency is analogous of the dependency on T1 and T2 in the post-processing method. Subsequently, one of the methods known in the industry is used to invert these stacked data with proper modifications for different noise magnitude in echo train segments stacked with different number of depths. The dependency of the number of the stacked depths on the sub-measurement and echo train segment is chosen based on the results of the inversion of synthetic data. The results obtained for the post-processing method serve as a good starting point.

One novelty of the embodiments described in this section is the variability of the number of stacked depths on T1 and T2 or alternatively on the sub-measurement and echo train segment.

Details of the Variable Depth Averaging of NMR Two-Dimensional (2D) Maps on Per T1-T2 Basis Key characteristics of the echo amplitude sensitivity with respect to T1 and T2 can be deduced from equation (5). The NMR kernel as given by equations (6), (11), (10) or any other feasible adjustment do not change key features of the echo amplitude sensitivity. In addition, from equation (5), it can easily be seen that the sensitivity drastically deteriorates when T1 or T2 goes out of the range covered by the acquisition. Namely, T2 sensitivity is very low for T2 not exceeding several decades of TE or, on the contrary, exceeding CPMG length. T1 sensitivity is very low for T1 outside the range of WT used in the sequence. Therefore, for low and high T1 and T2, relatively unstable inversion results are expected, in spite of the results stability for T1 and T2 in the middle range. High, low, and middle should be considered with respect to the acquisition sequence parameters: WT range for T1, TE, and longest CPMG length for T2.

Stacking (i.e., depth averaging) is a common method to improve NMR results stability in the industry. However, the price for improving stability is a reduction in resolution. As demonstrated above, stability improvement can be necessary only over certain regions of the map, such as the boundaries of the covered range of T1 and T2. Thus, variable stacking may be used for various T1 and T2 values as a procedure for stability improvement.

Once T1-T2 inversion is performed for a depth interval, an inversion T1-T2 map result in the form $P_{ij}(d)$ may be considered, where i and j are indices for T1 and T2 and d is a depth index. Most often, inversion itself is performed with discretized relaxation times corresponding to the point sources. If this is not the case, then i, j indices can either correspond to the characteristic times of non-point (e.g., rectangular or Gaussian shaped) sources used in the inversion or to T1 and T2 points of the resulting maps discretized post-inversion. If the inversion is one-dimensional (as a rule T2) when only one relaxation time index is known, the T1 and T2 indexed map degenerates into the distribution. In this case, the sense of the relaxation time indices does not change, just two indices are replaced by one. For the purpose of stability improvement, the following depth averaged map may be used:

$$\overline{P_{ij}}(d) = P_{ij}(d) * W(d', s_{ij}) \tag{20}$$

where asterisk * designates moving window averaging with window function $W(s_{ij}, d')$ of the width $s_{ij}$ (i.e., number of stacked depths) depending on T1 and T2. For the sake of not introducing depth shift in the results, only a symmetric window function with an odd value of the width is used. For the sake of preservation of overall fluid volume characteristics, the sum of all elements of the window function must be equal to 1.

Any window function with the features described above can be used, but it has been found that particularly effective ones are boxcar:

$$W_b(d', s) = \begin{cases} 0, & d' < -\frac{s-1}{2} \\ \frac{1}{s}, & -\frac{s-1}{2} \le d' \le \frac{s-1}{2} \\ 0, & d' > \frac{s-1}{2} \end{cases} \tag{21}$$

and trapezoid:

$$W_t(d', s) = \begin{cases} 0, & d' < -\frac{s-1}{2} \\ \frac{1}{2\cdot(s-1)}, & d' = -\frac{s-1}{2} \\ \frac{1}{s-1}, & -\frac{s-1}{2} < d' < \frac{s-1}{2} \\ \frac{1}{2\cdot(s-1)}, & d' = \frac{s-1}{2} \\ 0, & d' > \frac{s-1}{2} \end{cases} \tag{22}$$

Figure 11:
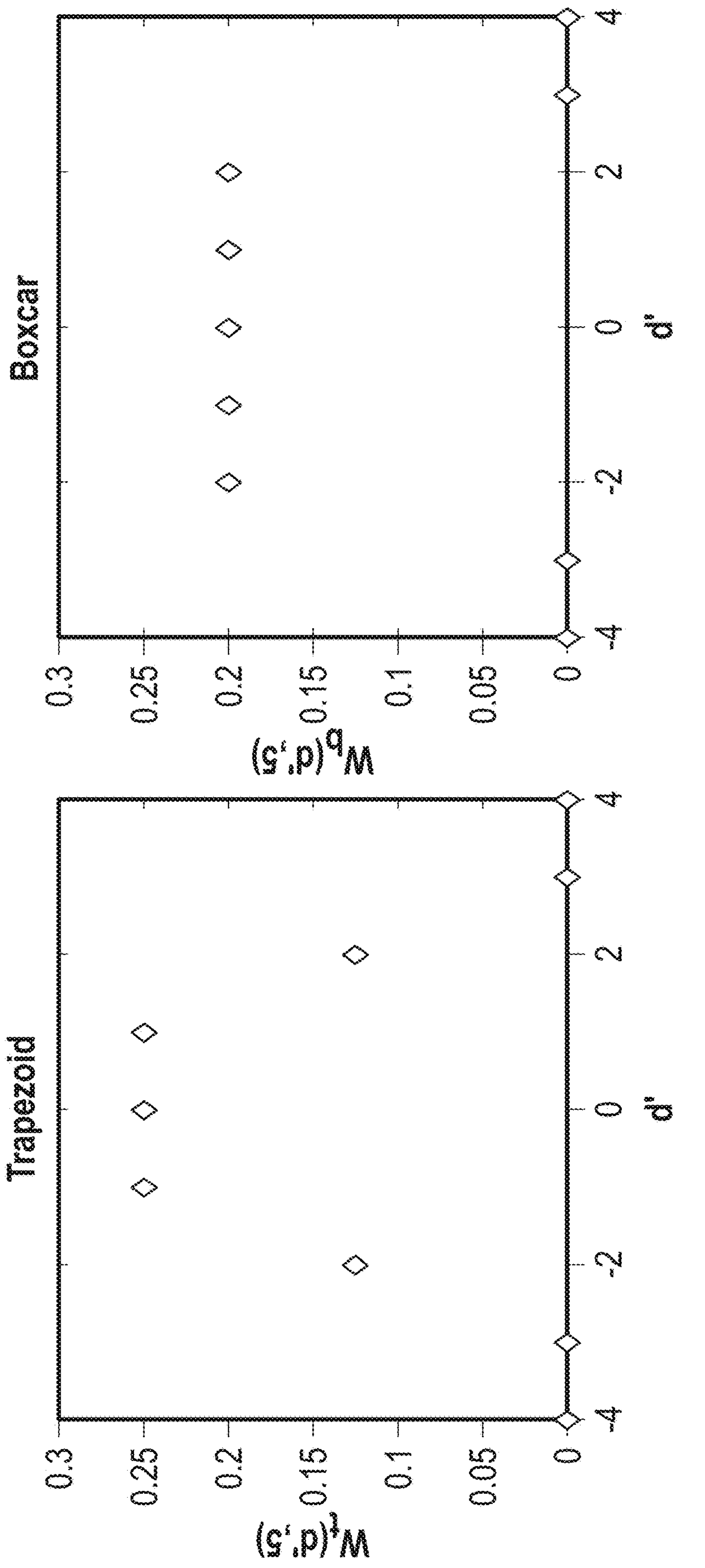
FIG. 11 demonstrates an example of trapezoid and boxcar window functions, in accordance with embodiments of the present disclosure.

Equations (21) and (22) describe the case of s>1. In the case of s=1, any window function degenerates into the single argument Kronecker delta. s is an odd integer for any window function. FIG. 11 demonstrates an example of the trapezoid and boxcar window functions (e.g., having a width of 5).

According to equation (5), it is reasonable to position boundaries where window function width changes along the lines of constant T1 or T2. Therefore, the following scheme for setting widths $s_{ij}$ is proposed—intervals of the relaxation times involved in the inversion $[T1_{min}, T1_{max}]$ and $[T2_{min}, T2_{max}]$ may be divided into p subintervals $T1_{min} \le T1B_1 \le \ldots T1B_{p-1} \le T1_{max}$ and $T2_{min} \le T2B_1 \le \ldots T2B_{p-1} \le T2_{max}$ and force window function width to change at the boundaries of the rectangular areas defined by these subintervals division points. Namely:

$$s_{ij} = \begin{cases} s_1, & T1_{min} \le T1_i < T1B_1 \ \& \ T2_{min} \le T2_j < T2B_1 \\ s_2, & T1B_1 \le T1_i < T1B_2 \ \& \ T2B_1 \le T2_j < T2B_2 \\ \ldots & \\ s_{p-1}, & T1B_{p-2} \le T1_i < T1B_{p-1} \ \& \ T2B_{p-2} \le T2_j < T2B_{p-1} \\ s_p, & T1B_{p-1} \le T1_i < T1_{max} \ \& \ T2B_{p-1} \le T2_j < T2_{max} \end{cases} \tag{22}$$

Figure 12:
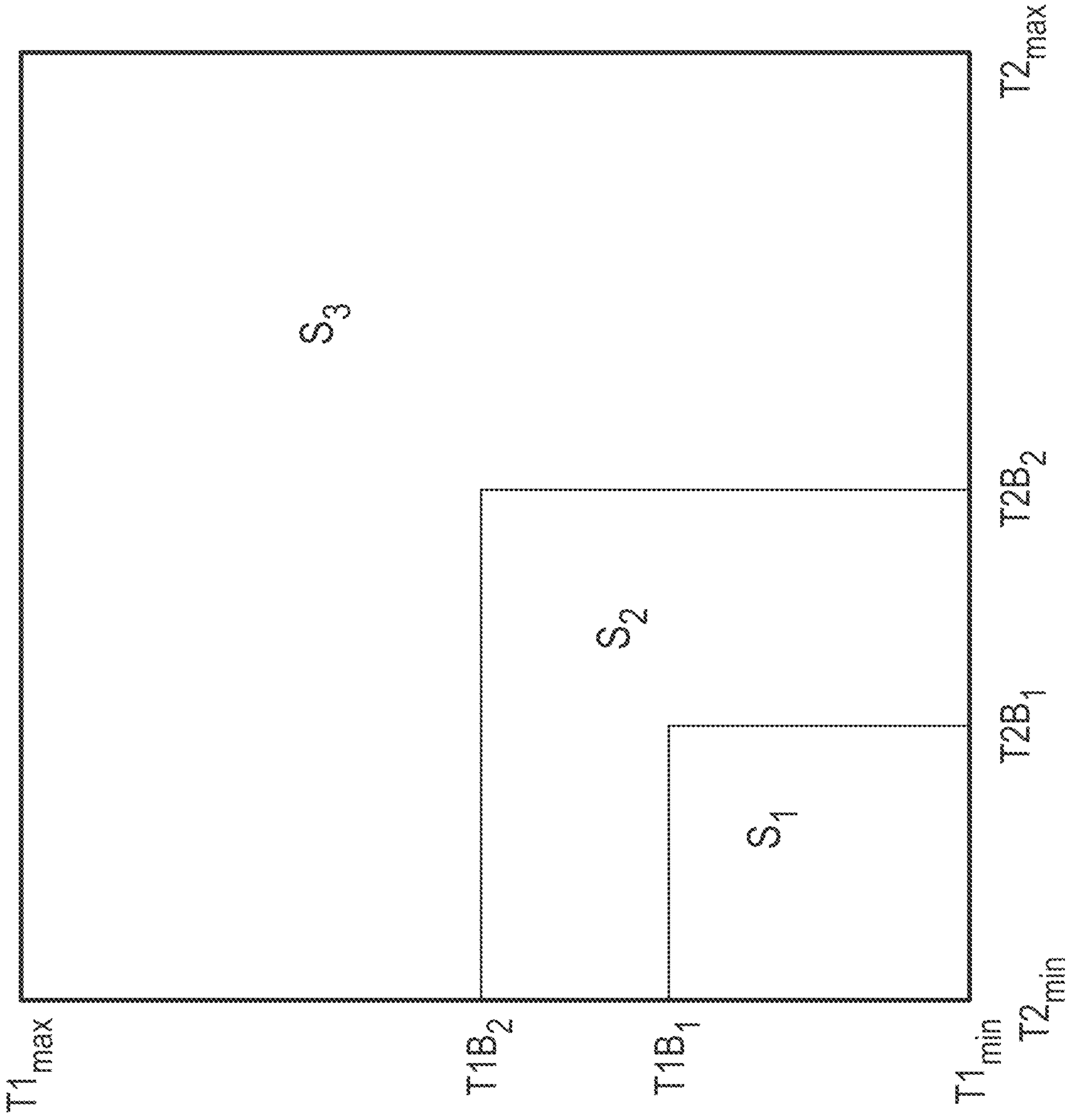
FIG. 12 is a schema of three zones of a window function width for T1 and T2, in accordance with embodiments of the present disclosure.

FIG. 12 illustrates equation (23) in the case of 3 zones (p=2). In particular, FIG. 12 is a schema of three zones of a window function width for T1 and T2. It is not required that all of the zone boundaries for T1 and T2 be different and lie strictly within respective T1 or T2 segments of interest. This approach gives enough flexibility to design an averaging scheme to achieve desired stability of the T1-T2 maps without significant deterioration of resolution. A non-limiting example is a case in which all T1 boundaries merge into the upper boundary of the interval of interest $T1_{min} < T1B_1 = \ldots T1B_{p-1} = T1_{max}$ corresponds to window function width depending only on T2. Values of window function width s in the middle of the T1-T2 square of interest should be set to 1. An increase of s when T2 and/or T1 approaches the edges of the square is the proposed method to achieve inversion results stability.

Setting values of window function widths and T1-T2 subintervals boundaries is done through a sensitivity study on synthetic NMR data. First, representative sets of fluids are picked for the task and T1-T2 sources are designed to emulate these fluids. Then, synthetic NMR data according to kernels given by equations (5), (6), (11), or (10) are generated with noise with proper magnitude added to them. Then, inversion of choice is run for these data followed by depth averaging of inversion results according to the equations (20) and (23). Averaged results are compared to known underlying T1-T2 maps. Starting from 1, window function widths are adjusted until an acceptable trade-off between stability and resolution is achieved. Choice of window function widths established in this manner depend on the sets of fluids, magnitude of noise, inversion algorithm and specific inversion parameters defined by this algorithm. If one of these changes window function widths, the selection process is redone with the new.

Very often, compression of individual echoes is used by the inversion. In this case, natural points to consider as T2 subinterval boundaries are window sum boundaries or echo times with dominant contribution to the respective linear combination for kernel-based compression methods such as singular values decomposition. Natural points to consider as T1 subinterval boundaries are WT of the acquisition sequence.

For the sake of performance, inversion with T1-T2 discretization is very often performed on the coarser grid with subsequent interpolation of resulting T1-T2 maps into refined grid. In this case depth averaging should be done on the coarser grid intermediate results with subsequent interpolation of the averaged results into the refined grid.

TABLE 3

Properties of the T1-T2 acquisition sequence used for window function widths selection process.

| Sub-measurements | SM1 | SM2 | SM3 | SM4 | SM5 | SM6 |
|---|---|---|---|---|---|---|
| NE | 1800 | 600 | 100 | 50 | 20 | 20 |
| Number of CPMG PAPs | 1 | 2 | 10 | 30 | 50 | 50 |
| TE (us) | 200 | 200 | 200 | 200 | 280 | 280 |
| WT (s) | 2 | 0.3 | 0.05 | 0.01 | 0.003 | 0.0012 |

Proposed window function widths selection process have been performed for the six sub-measurements NMR acquisition sequence specified in the Table 3 using synthetic data with equation (5) kernel. It employs discretized T1 and T2 and applies Tikhonov regularization with automatic determination of the regularization parameter. [1 msec, 3000 msec] and [0.5 msec, 3000 msec] intervals have been used for T1 and T2 respectively. A 32·32 grid has been used for inversion maps with subsequent interpolation to 64·64 grid. As the result of the process described above, T2 only was chosen based window function widths selection with three zones, T2 boundary values of 2 msec and 5 msec, respective width values of 5, 3, and 1 and trapezoid filter shape.

Echo Stacking with Variable Stacked Number

Variable depth averaging of the inverted NMR 2D maps on a per T1-T2 basis described above should produce satisfactory results only in the case when fluid properties do not significantly change within the averaging interval. If this is the case, then the NMR echo trains also do not significantly change within that interval. By increasing the number of stacked depths, noise can be reduced and the resolution, accuracy, and stability of the inversion may be improved. The post-inversion method described above does not give advantage of that noise reduction.

However, to avoid resolution deterioration in T1T2 map regions where the noise level from the standard method is acceptable, a different number of stacked depths should be used for different parts of the echo train. Consequently, these different parts (even if they belong to the same sub-measurement) would have different noise magnitude. Therefore, these different parts must be treated as separate sub-measurements. Following window function widths selection described by equation (23), each sub-measurement of the acquisition sequence is divided into p new sub-sub-measurements. This division is done based on echo times with echo times boundaries corresponding to the T2 boundaries from equation (23). If the compression is performed in the inversion, sub-sub-measurement should correspond to the subset of window sums or subset of kernel-based linear combinations of echo amplitudes.

The kernel functions for these sub-sub-measurements are the same as before and governed by (5), (6), (11), or (10). It is the observed echo amplitudes together with corresponding noise magnitude that change. To get these values, depth stacking must be performed for the entire echo train with all different numbers of stacked depths involved. Performing stacking for the entire echo train, rather than just echo segment corresponding to the sub-sub-measurement, is necessary for proper noise magnitude evaluation. After that, each sub-sub-measurement is assigned proper echo train (or its linear combination) and noise magnitude. As a rule, inversion already uses echoes stacked through $s_0$ depth samples (with so being odd integer to avoid depth shift). Window function widths s from equation (23) that are greater than 1 infer additional stacking, namely corresponding to stacking of $s_0+s-1$ depth samples. So, resulting numbers of stacking depths for each sub-sub-measurement echoes and noise are defined with s following equation (23) with T1 corresponding to WT and T2 corresponding to the echo times. Usually, echoes on the different depth samples are stacked with the identical weight. That is, boxcar window averaging is used. However, any symmetric window function (e.g., trapezoid) can be used with depth samples weights assigned accordingly.

Once echo train (or its linear combination) and noise magnitude for each sub-sub-measurement are determined the inversion follows the same algorithm as before since the NMR kernels are not changing. Again, setting values of window function widths and T1-T2 subintervals boundaries should be done by a sensitivity analysis, through inversion of the synthetic NMR data in the manner described above for post-inversion process with the replacement of the inversion with subsequent averaging into the per sub-sub-measurement stacking followed by the inversion. Window function widths selection established by post-inversion-based process is a good starting point for per sub-sub-measurement stacking based process.

Applicability to Data Acquired by Other Tools, Pulse Sequences, and Inversions

The embodiments described in this section use the example of NMR T1-T2 logging. However, the embodiments described in this section apply equally to echo data (pre-processing method) and/or inverted data (post-processing method) acquired by any NMR logging tool. In particular, they apply equally regardless of the dimensionality of the output. For example, they apply to one dimensional T2, T1 or diffusion measurement and inversion schemes, to two dimensional T1 and diffusion (or T2 and diffusion) measurement and inversion schemes, and to three dimensional T1, T2, and diffusion measurement and inversion schemes.

(3) NMR Kernel Correction

Introduction

Accuracy and precision of the inverted T1-T2 maps directly impacts all subsequent analyses and therefore this accuracy is very important for formation evaluation. However, analyses have demonstrated that existing techniques of producing T1-T2 maps can lead to significant distortion of the results both in terms of individual fluid components and total fluid volume. The proposed inversion kernel adjustment method described herein is new and capable of significant improvement of fluid characterization. Conventional techniques have generally been divided into two categories:

- Methods to improve forward model accuracy (i.e., methods to produce more accurate NMR echo train approximation given T1-T2 of the fluid components).
- Methods to improve inversion accuracy and precision in which forward modeling aspect is considered to be known and not discussed.

In general, the embodiments described in this section fall into the first category and can be used with any inversion method such as Tikhonov regularization, rigorous Bayesian inference methods, and heuristic stochastics methods. Conventional methods of improving forward model accuracy do not deal with the effects important for multi-wait time (three or more) sequences such as steady state buildup or with the effects of low antenna quality factor (Q) specific for the tool (CMR) used for T1-T2 mapping.

The embodiments described in this section focus on improving forward model accuracy for multi-wait time NMR sequences with variable antenna Q (i.e., done in reasonable time and subsequently delivering just-in-time or even real-time answers). Any type of inversion can be used with the embodiments described in this section. Improving accuracy of the forward model with regard to multi-wait time NMR sequences with variable antenna Q in a fast enough manner is one novelty of the embodiments described in this section.

Summary of the NMR Kernel Correction

In general, the embodiments described in this section improve the accuracy of the forward modeling of the NMR echo train for the specific tool for which T1-T2 map inversion is to be performed. This improvement is done in the following manner:

- The computational model, also known as virtual prototype, is built for the NMR tool in consideration in order to model with reasonable accuracy NMR echo trains for the tool in reasonable time while taking into account effects of NMR spin dynamics (including steady state build up as discussed below) and the variation of the tool's operating conditions such as transmission pulse strength and the receiver bandwidth characterized by the antenna's quality factor (Q).
- Virtual prototype results are validated with the laboratory experiments to achieve a reasonable match. Based on these experimental data, virtual prototype parameters are chosen and adjusted.
- Subsequently, virtual prototyping is performed on typical NMR acquisition sequences with a set of T1-T2 sources that covers well T1-T2 are representative for the inversion.
- The NMR kernel currently used in the inversion is parameterized and its parameters such as time values corresponding to the exponential echo train decay (apparent T2) and actual amplitudes of the different acquisition sub-sequences corresponding to different wait times (sub-measurements amplitude corrections) are adjusted for every T1-T2 pair and Q value to match the virtual prototype.
- NMR inversion is then performed using kernels with parameters adjusted as described above. In between T1, T2 and Q values for which virtual prototyping is performed, parameters of interest are determined by interpolation.

One novelty of the embodiments described in this section is the determination of the apparent T2 as well as sub-measurements amplitude correction values from the experimentally validated virtual prototyping for a representative set of the source T1, T2, antenna Q values and NMR acquisition sequences.

Details of the NMR Kernel Correction

Figure 13:
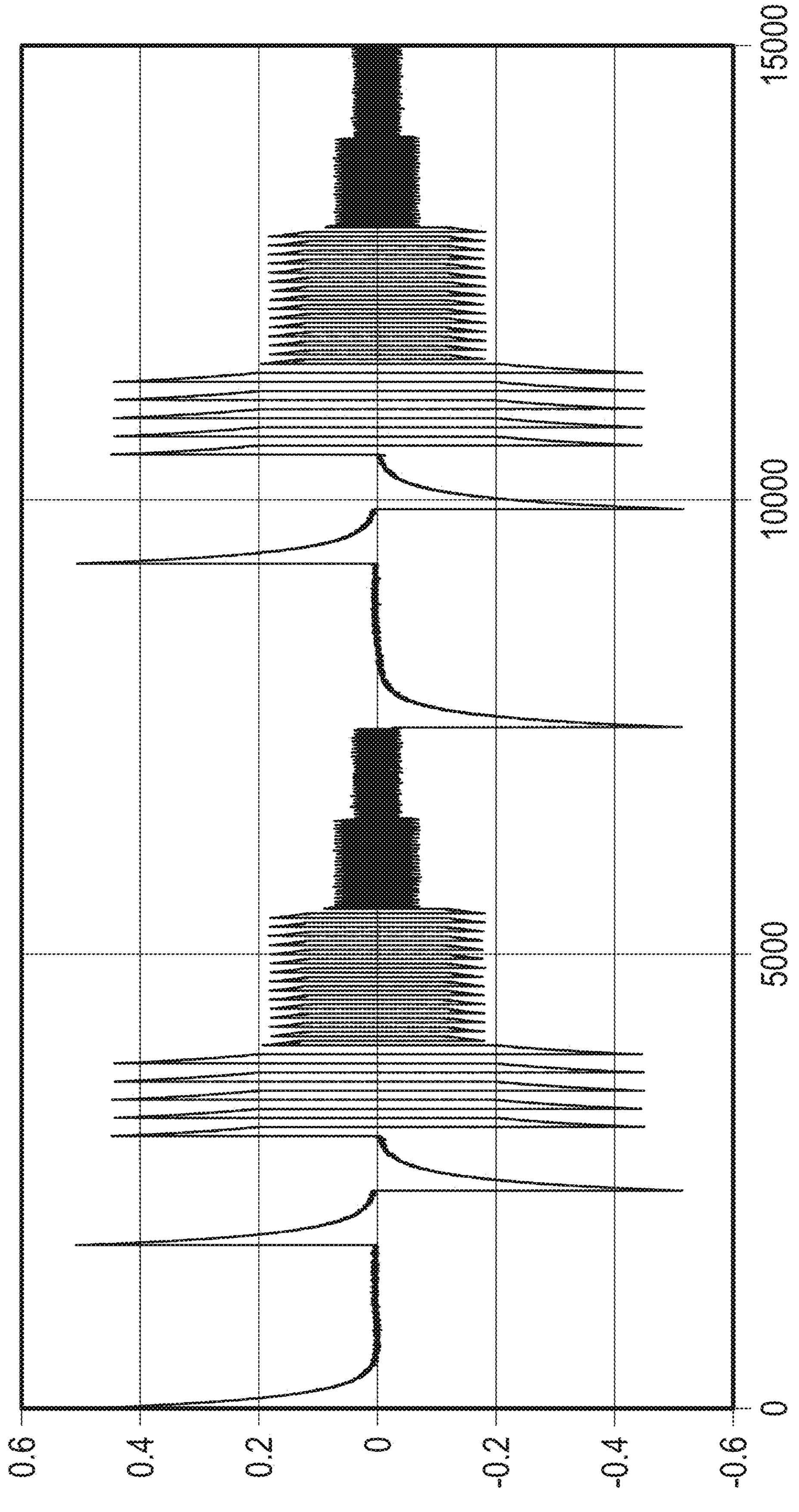
FIG. 13 demonstrates SSBU effect by comparison of spin echoes amplitude for a typical T1-T2 sequence, in accordance with embodiments of the present disclosure.
Figure 14:
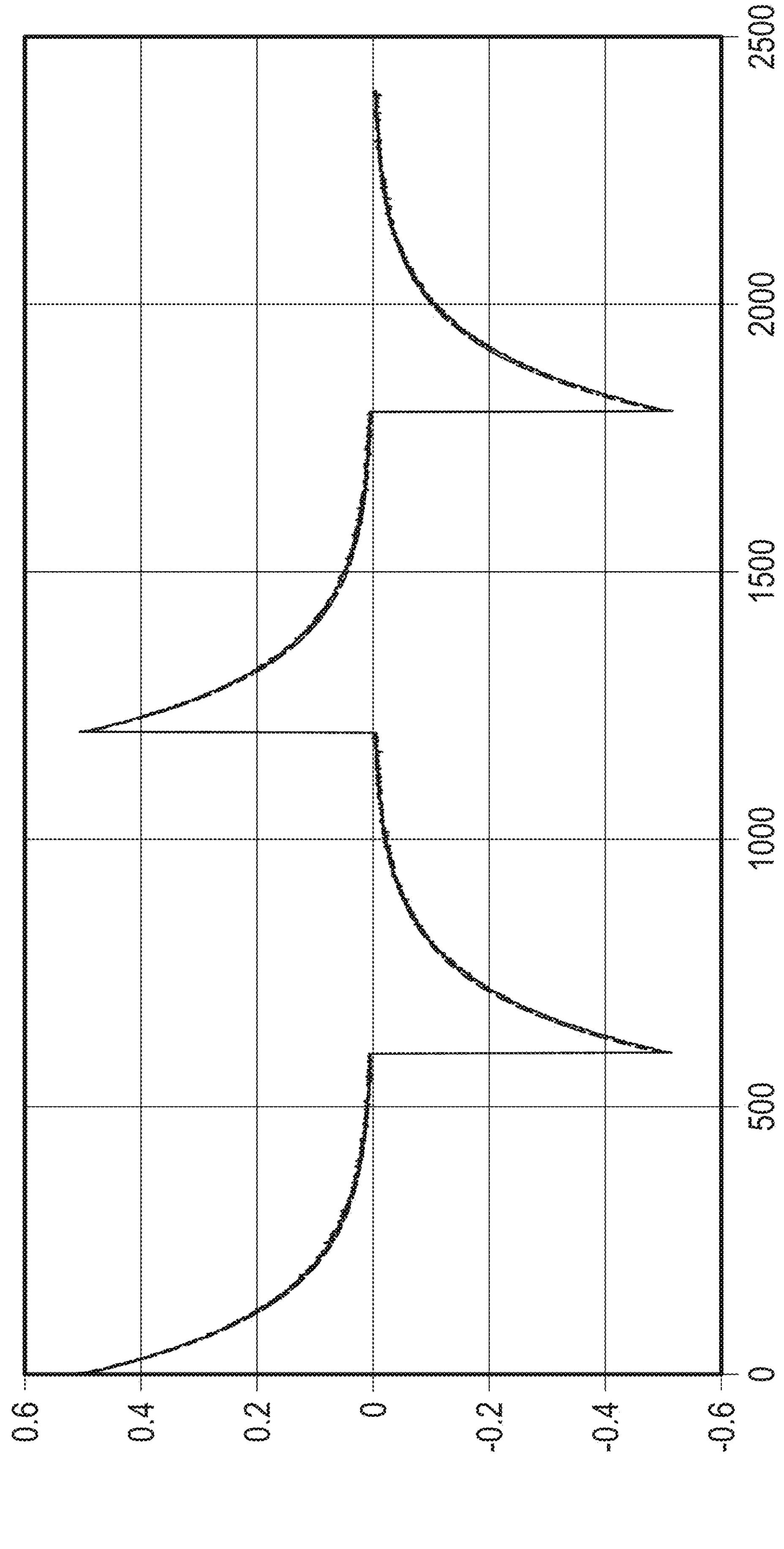
FIGS. 14-16 are comparisons of laboratory data, virtual prototype results, and results given by idealized kernel for various sub-measurements, in accordance with embodiments of the present disclosure.
Figure 15:
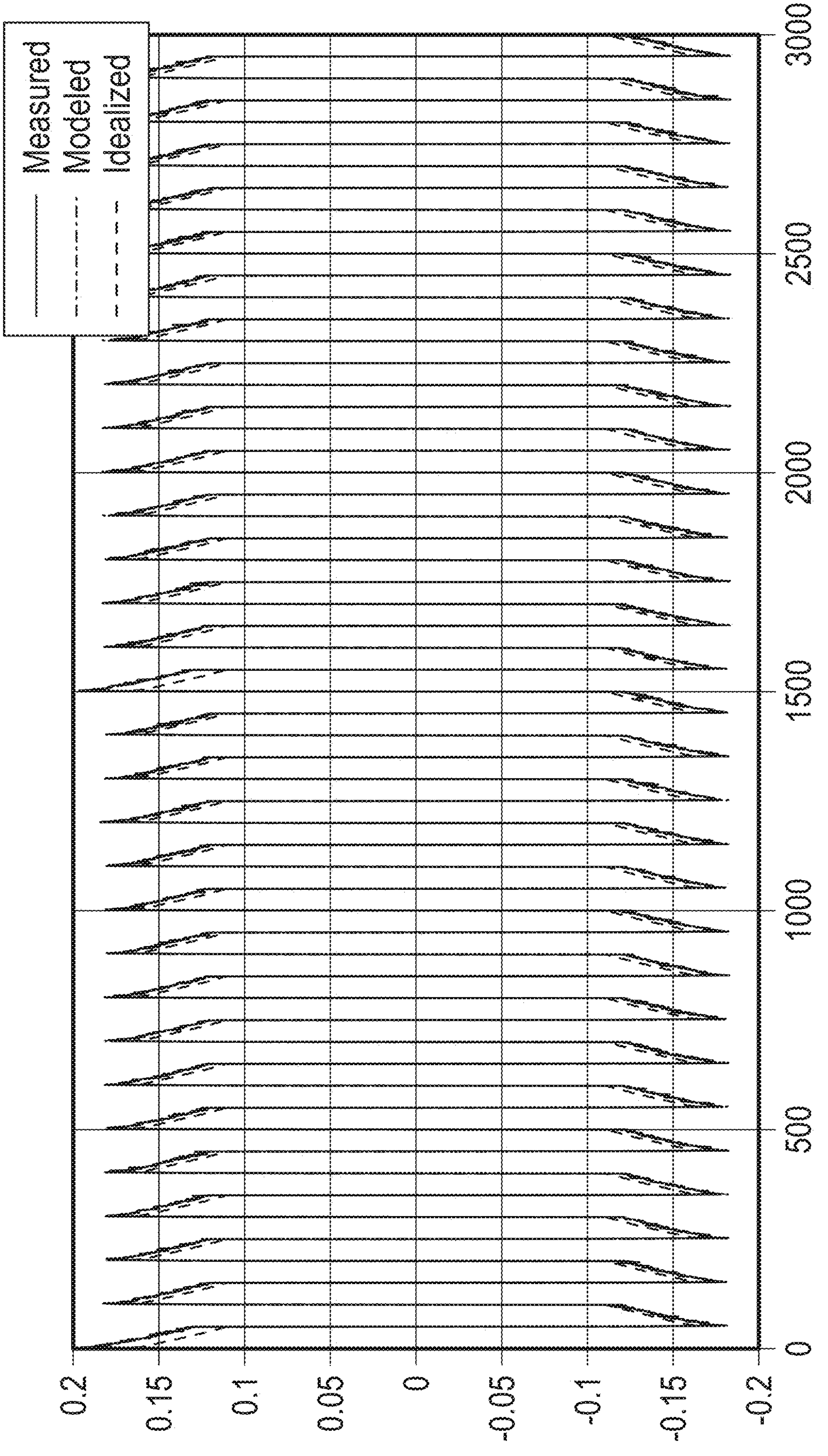
Figure 16:
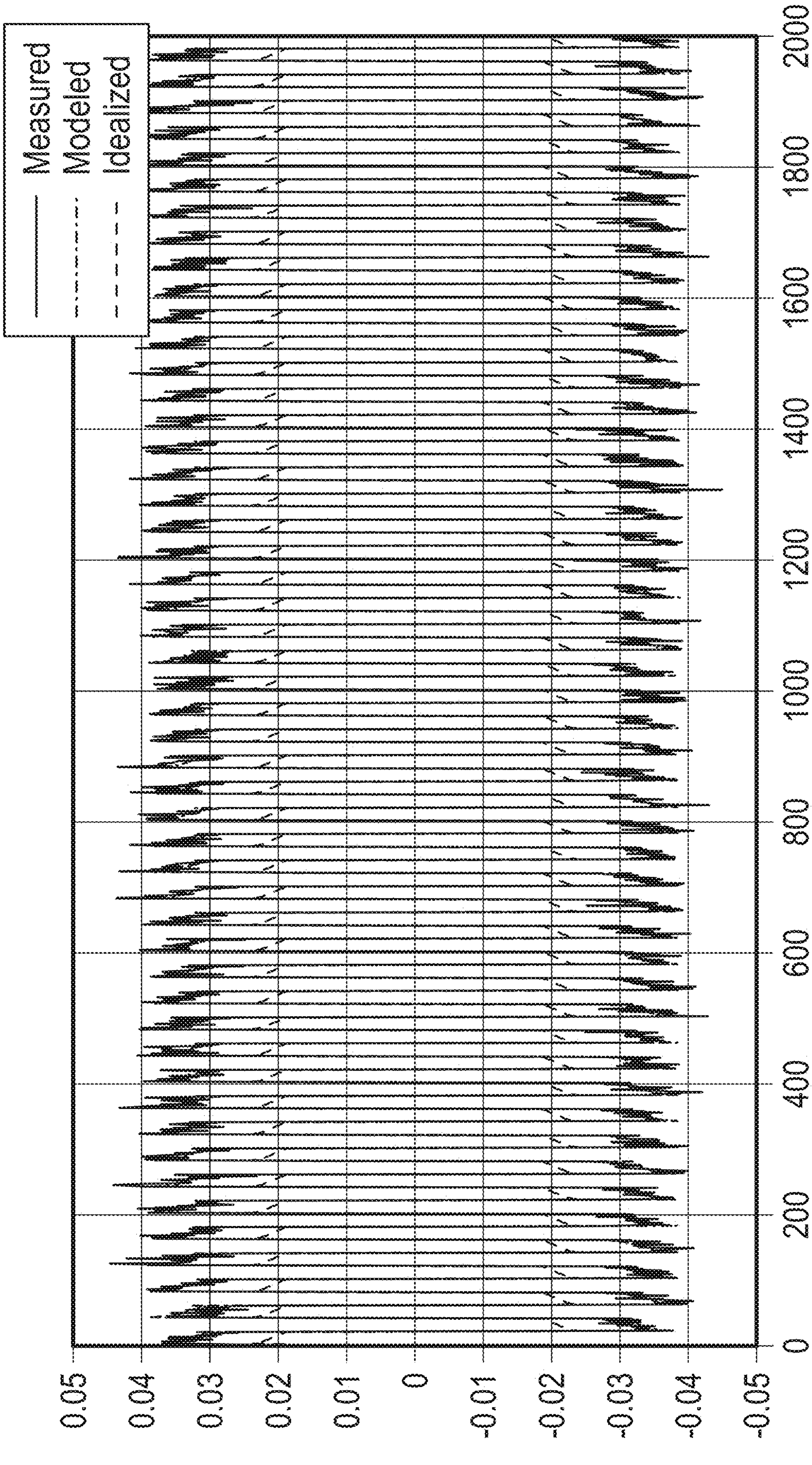

Returning now to the discussion of SSBU above, FIG. 13 demonstrates an SSBU effect by comparison of the spin echoes amplitude for a typical T1-T2 sequence. The sequence consists of six sub-measurements with the properties listed in the Table 4. Comparison of laboratory data (red), virtual prototype results (blue) and results given by idealized kernel (green) is presented in FIG. 13. FIG. 14, FIG. 15, and FIG. 16 are comparisons of laboratory data (red), virtual prototype results (blue) and results given by idealized kernel (green) for SM2, SM4, and SM6, respectively, of the Table 4 sequence.

TABLE 4

Properties of a typical T1-T2 acquisition sequence used for the data in FIGS. 13-16

| Sub-measurements | SM1 | SM2 | SM3 | SM4 | SM5 | SM6 |
|---|---|---|---|---|---|---|
| NE | 1800 | 600 | 100 | 50 | 20 | 20 |
| Number of CPMG PAPs | 1 | 2 | 10 | 30 | 50 | 50 |
| TE (us) | 200 | 200 | 200 | 200 | 280 | 280 |
| WT (s) | 2 | 0.3 | 0.05 | 0.01 | 0.003 | 0.0012 |

NMR data are acquired in so called B mode: positive CPMG of SM1, followed by half of CPMG PAPs of SM2-SM6, followed by negative CPMG of SM1, finally followed by another half of CPMG PAPs of SM2-SM6. The red curves in FIGS. 13-16 demonstrate laboratory CMR-Plus tool spin echoes amplitudes with the sample of doped water bottle with T1≈T2≈25 msec, antenna Q≈40, noise magnitude≈0.02 per echo. 205 depth samples are acquired and laboratory data are stacked for all depth sample to reduce resulting noise. The blue curves in FIGS. 13-16 demonstrate results of virtual prototyping with numeric modeling described below for this laboratory experiment assuming no noise. The green curves in FIGS. 13-16 represent NMR kernel in ideal conditions as given by equation (3). It can be seen that the SSBU effect is apparently negligible for SM1-SM3, becomes visible for SM4 and quite significant for SM5-SM6 (see FIGS. 14-16). It also can be seen that virtual prototyping corresponds to the laboratory measurements with high accuracy. It is also noted that in course of comparison of virtual prototyping results with equation (3) kernel, that for the best match between two T2 values in equation (3) must be adjusted with respect to its nominal value.

Discrepancy between actual spin echo sequence and idealized kernel of equation (3) results in systematic overcall of the inverted NMR porosity and underestimation of T1 since the inversion tends to accommodate significant SSBU effect in the later sub-measurement by overall porosity increase and faster polarization.

Figure 17:
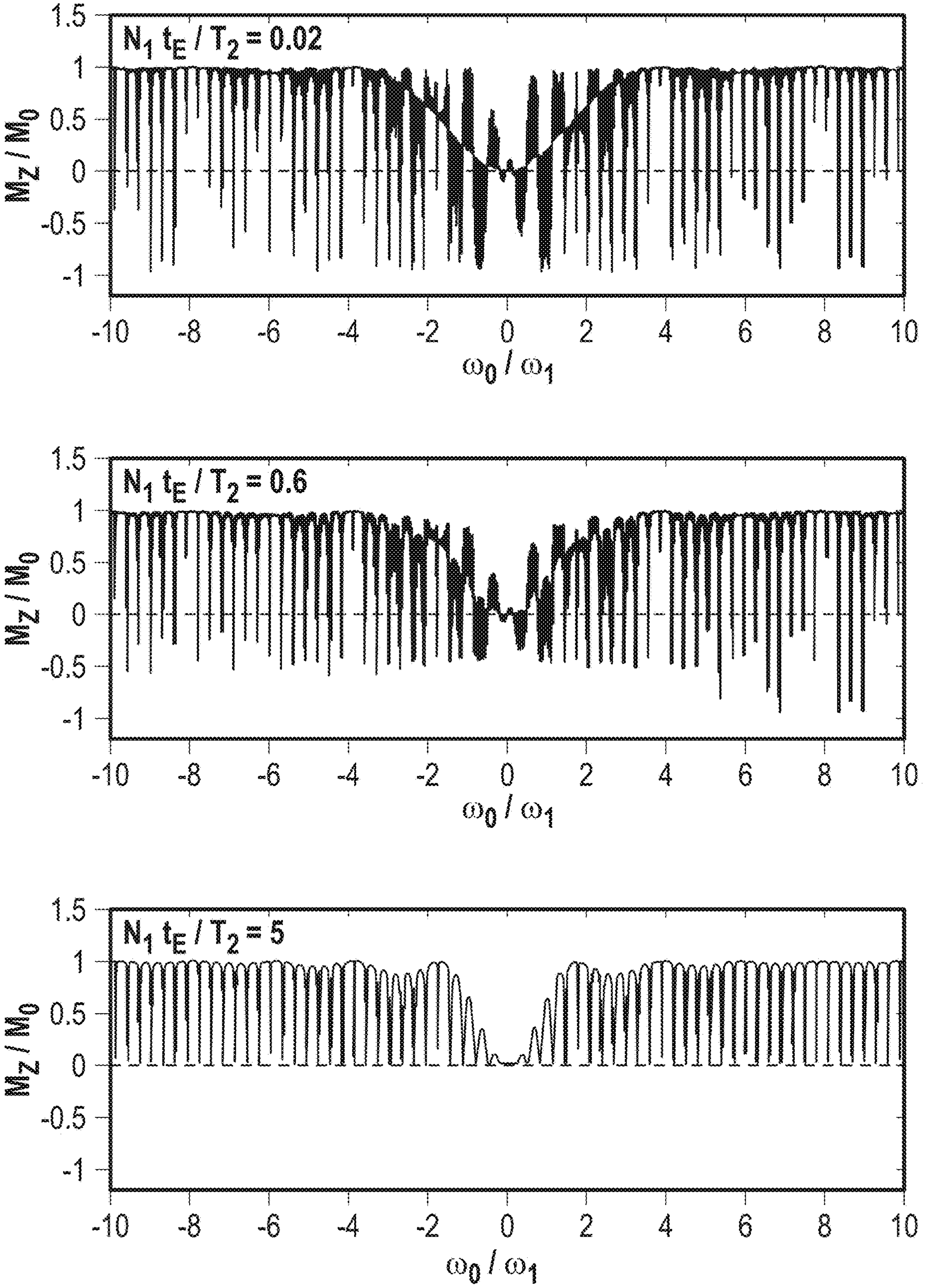
FIG. 17 shows an example of normalized longitudinal magnetization at the end of a CPMG as a function of a sample property and sequence parameters, in accordance with embodiments of the present disclosure.

FIG. 17 shows normalized longitudinal magnetization at the end of a CPMG, as a function of frequency offset. In particular, FIG. 17 shows an example of normalized longitudinal magnetization $M_Z$ at the end of a CPMG as a function of sample property (T2) and sequence parameters ($N_1$ and $t_E$). FIG. 17 demonstrates the SSBU effect on a sequence with echo spacing $t_E$ made of two CPMG with $N_1$ and $N_2$ echoes in each.

At resonance (i.e., $\omega_0/\omega_1=0$), longitudinal magnetization is zero, which then recovers to the thermal equilibrium during wait time (WT) by following equation (3), as schematically represented by a blue curve in FIG. 4. However, off-resonance spins have non-zero longitudinal magnetization, whose amplitude and sign depend on the amount of frequency offset, as well as sample properties (T1 and T2) and measurement parameters (WT, NE and TE). As a result, the net magnetization (i.e., the sum over a given frequency range) can be positive as shown in FIG. 5. The amount of deviation from what equation (3) expects (i.e., the difference between blue solid line and blue dashed line in FIG. 5) depends on the signal bandwidth in addition to the sample/measurement parameters mentioned above.

Figure 18:
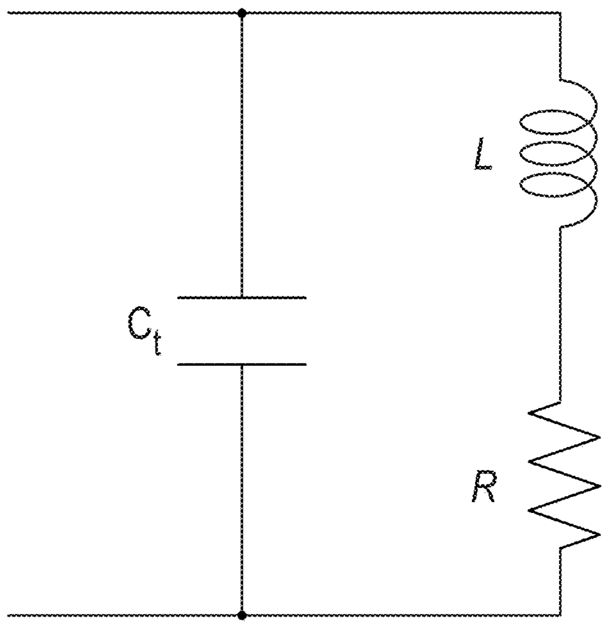
FIG. 18 depicts a typical NMR sensor coil configured as a parallel-tuned circuit, in accordance with embodiments of the present disclosure.

FIG. 18 depicts a typical NMR sensor coil configured as a parallel-tuned circuit. Observed signal bandwidth is affected by the quality factor Q of the NMR antenna (i.e., the sensor coil), which comprises a parallel-tuned circuit (as illustrated in FIG. 18). For such a circuit, the bandwidth of the transfer function is given by:

$$\Delta\omega = \frac{\omega_c}{Q} \tag{24}$$

and:

$$Q = \frac{\omega_c L}{R} \tag{25}$$

where $\omega_c$ is the circuit's resonant frequency and given by:

$$\omega_c = 1/\sqrt{LC_t} \tag{26}$$

Figure 19:
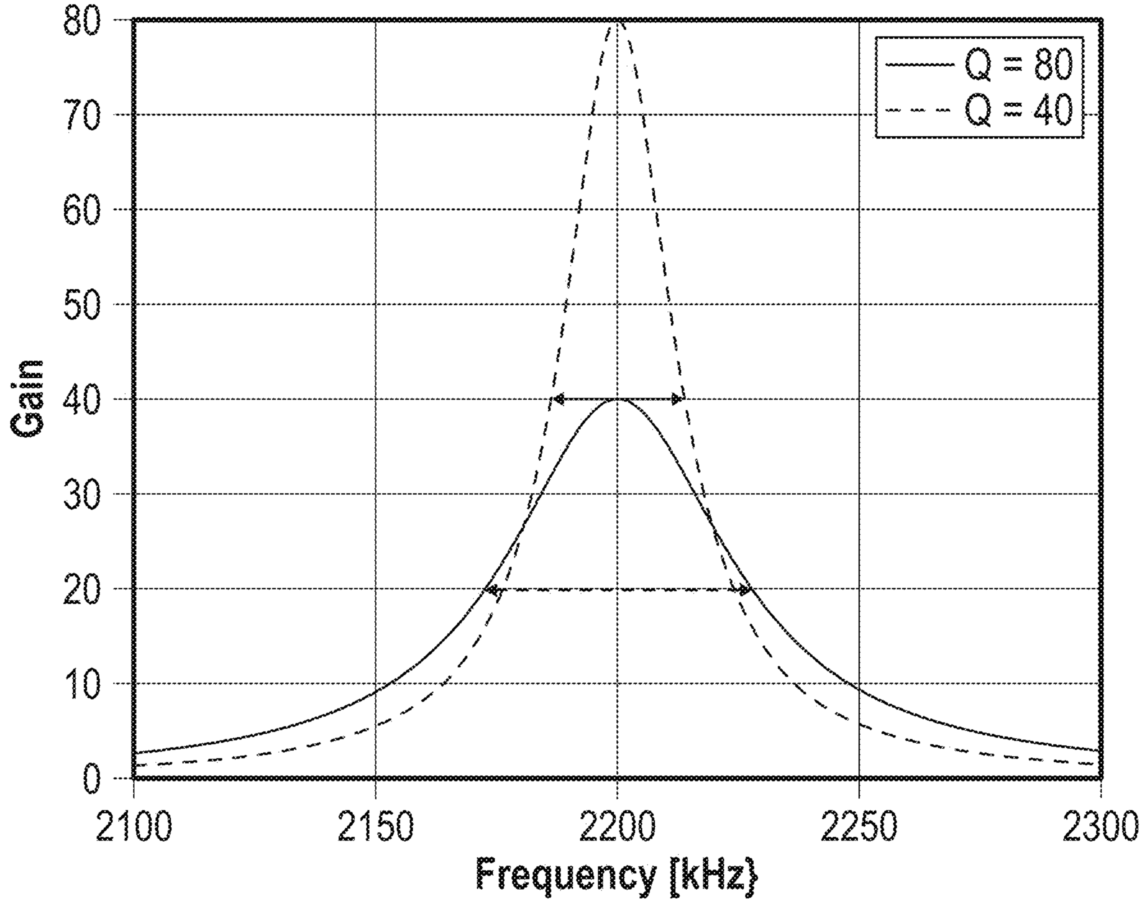
FIG. 19 shows an example transfer function defined for a sensor circuit as shown in FIG. 18, in accordance with embodiments of the present disclosure.

Usually, tuning capacitor $C_t$ is adjusted to satisfy $\omega_c=\omega_0=\gamma B_0$ to achieve maximum gain. FIG. 19 shows an example transfer function defined for a sensor circuit as shown in FIG. 18. When Q is reduced, peak amplitude (corresponding to the antenna gain, which is calibrated in NMR well logging) decreases, while signal bandwidth increases (assuming there are no other hardware/software filters that limit the signal bandwidth), resulting in wider coverage of off-resonance spins shown in FIG. 17, leading to more pronounced SSBU effect.

In order to characterize sub-measurement amplitude ratio and effective T2 in equations (11) or (10), virtual prototyping of the tool with numerical modeling should be conducted. This is done in the following manner. The behavior of the nuclear spins in a typical CMR measurement (see Table 1) was simulated based on the Bloch equations. This is so called spin dynamics simulation. However, such physics-only simulation does not provide the size of the contributions from each spin, which becomes available only by knowing the exact excitation and received bandwidths, which are determined by the operation of frontend electronics, namely a transmitter and receiver. In addition, the operation of the frontend electronics depends on the impedance of the connected load/source, which is the NMR sensor. Furthermore, sensor impedance changes with the particular environment (e.g., borehole/formation conductivity, temperature). Therefore, this is a relatively complicated problem.

To simulate a complete CMR measurement in a dynamic environment, a physics (i.e., spin dynamics) model was combined with an electrical model of the frontend electronics and the electromagnetic model of the NMR sensor. This is called a virtual prototype of the NMR tool. For a given operating environment, often characterized by the antenna Q (which is measurable downhole), the impedance of the NMR sensor is modelled based on the electromagnetics model, then estimating the voltage applied by the transmitter connected to the NMR sensor to determine the current running through the NMR coil. This yields the strength of the magnetic field generated by the transmitter coil at a given location in the formation. The result is combined with the distribution of the $B_0$ field generated by the magnets to compute spin dynamics at a given moment. The electromagnetic field (EMF) induced in the receiver coil (which is the same as the transmitter coil in case of CMR) by those spins is proportional to the size of the spin magnetization weighted by the sensitivity of the receiver coil at a given location. Since each spin precesses at a unique frequency, which is proportional to the local $B_0$, a resulting NMR signal (i.e., the sum of the EMF induced by a set of spins) is represented as a spectrum. This NMR signal spectrum is then amplified/filtered by a parallel-tuned circuit (FIG. 18) connected to the receiver. The transfer function of the entire receiver chain (including the NMR sensor) is obtained from an electrical model (for example, but not limited to, Spice or its variants). The resulting NMR spectrum is further filtered by a process that mimics the operation of the analog-to-digital converter and following digital filter to reduce the noise while maintaining the information in the NMR signal. Again, this entire process is necessary to simulate the behavior of the NMR signal measured under different operating conditions and achieved by a multi-physics model that mimics the operation of a real tool.

Virtual prototype results must be validated by laboratory measurements to achieve good match as demonstrated in FIGS. 13-16. Theoretically, one should use as many samples as possible for validation. However, only two doped water samples with short T1≈T2≈25 msec and with long T1≈T2≈750 msec and one oil sample with T1≈T2≈10 msec were available for validation in the example given. Virtual prototype results have demonstrated good matching with laboratory measurements for these samples for Q values in the 40-80 range. However, using just three samples may not be enough. Therefore, an additional validation of the inversion results with the modified kernel per equation (11) for the field data versus porosity measurements independent on NMR has been performed. The results described below have justified the proposed method.

To characterize sub-measurement amplitude ratio and effective T2 virtual prototyping must be performed for a series of T1 and T2 pairs and Q values that give representative sampling. For each T1, T2, Q triplet the functions are determined as ones providing the minimum misfit between the virtual prototype un-PAPS-ed echo train as per equation (10) or PAPS-ed echo train as per equation (11). Various norms such as L2, L1 or C (maximum absolute value of the difference) can be used. Then sub-measurement amplitude ratio and effective T2 for all other T1, T2, Q are obtained using interpolation and extrapolation using methods established in the industry. The fact that chosen sample is representative enough, that chosen method of misfit estimation as well as chosen method of interpolation are good enough should be substantiated using modified kernel for comparison of inversion results versus expected answers for synthetic data using virtual prototype results with added noise for laboratory data and for field data.

As a representative sample for T1, T2, a rectangular 16 by 16 grid of T1-T2 value pairs uniformly spaced on a logarithmic scale in range 1-3000 msec for T1 and 0.5-3000 msec for T2 was chosen. Unphysical values with T1/T2<0.5 that are not used for an inversion have been excluded. That choice renders 156 T1-T2 pairs. For all pairs, virtual prototyping for Q of 40, 60, and 80 have been performed for a sequence specified in Table 1. Virtual prototyping for all those samples have been performed for static magnetic field. Virtual prototyping for dynamic magnetic field has been also performed for samples corresponding to the above-mentioned laboratory measurements for several typical logging speed. The results for this subset have demonstrated that static magnetic field prototypes can be used to determine sub-measurement amplitude ratio $R_k$(T1, T2, Q) and T2 effective T2E(T1, T2, Q) in equation (11). For SM1, both $R_1$(T1, T2, Q) and T2E(T1, T2, Q) have been determined as values minimizing L1 misfit. Then, for SM2-SM6, the rest of $R_k$(T1, T2, Q) with given T2 effective as determined from SM1 have been established again to minimize L1 misfit.

Figure 20:
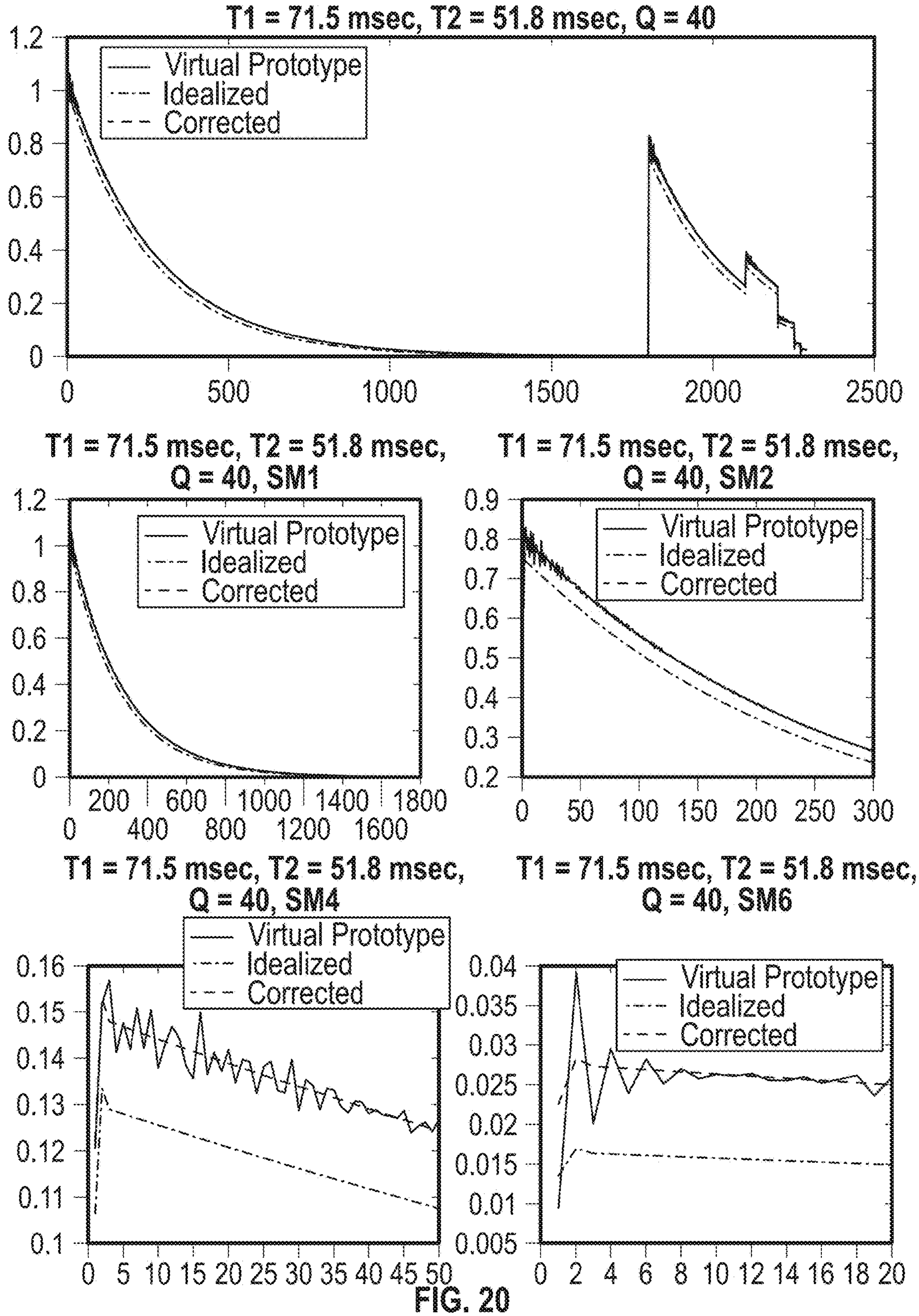
FIGS. 20 and 21 show fitting NMR kernel to virtual prototype phase-alternate pulse sequence (PAPS)-ed echo train results for one T1, T2, Q point of a sequence, in accordance with embodiments of the present disclosure.
Figure 21:
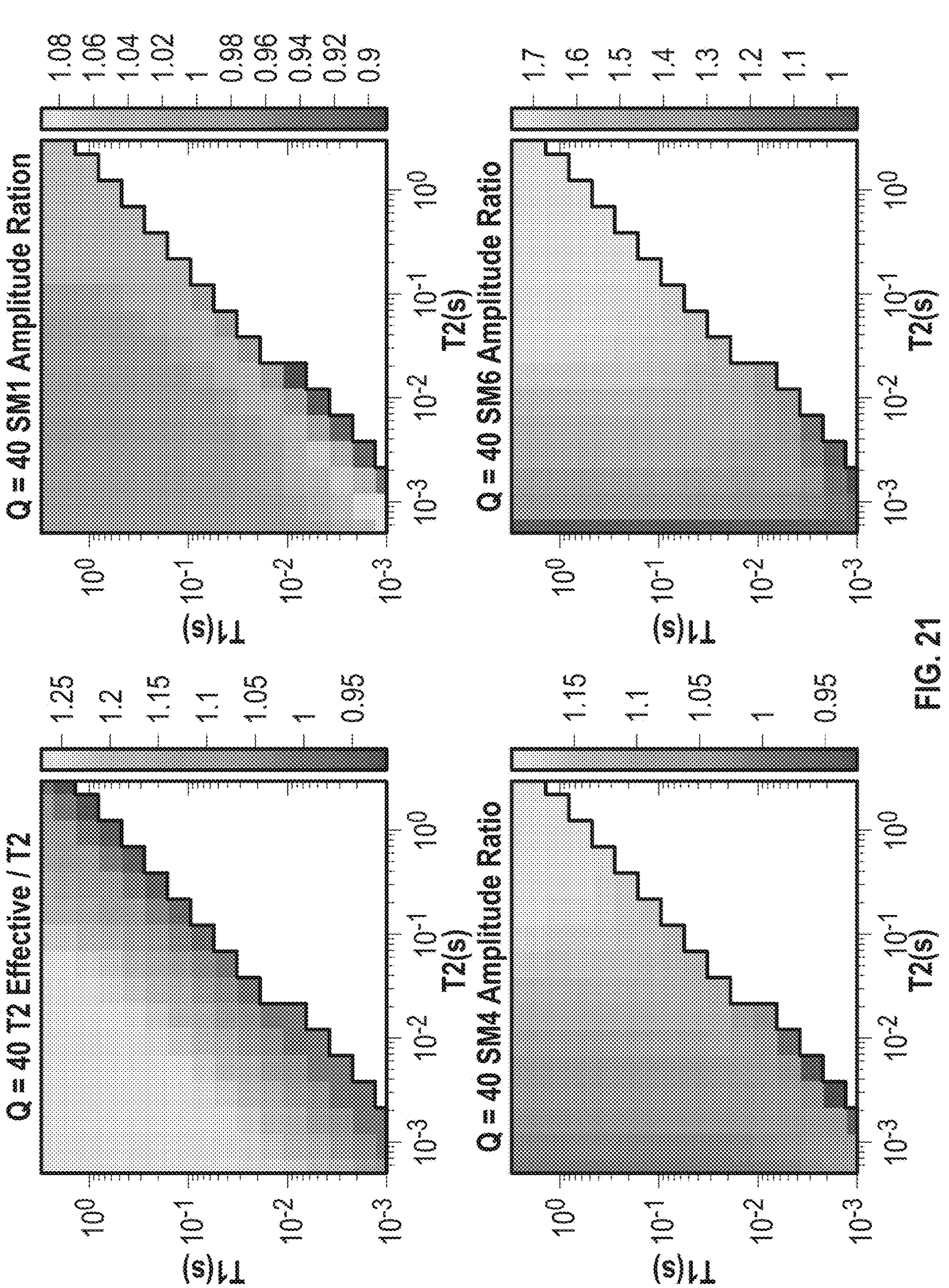

FIG. 20 demonstrates a fitting process for one typical T1, T2, Q point, and FIG. 21 shows results for Q=40. In particular, FIG. 20 shows fitting NMR kernel as per equation (11) to virtual prototype PAPS-ed echo train results for one T1, T2, Q point of the sequence specified in the Table 1. In addition, FIG. 21 shows results of fitting NMR kernel as per equation (11) to virtual prototype PAPS-ed echo train results for the sequence specified in the Table 1. Sub-measurement amplitude ratio and effective T2 between and beyond 3·156 sampling points are determined with interpolation and extrapolation. It is performed linearly for logarithms of the sub-measurement amplitude ratio and the effective T2 with respect to antenna Q and logarithms of T1 and T2.

Results of the Inversion with Corrected NMR Kernel

Finally, the proposed kernel correction has been validated by utilizing the corrected NMR kernel in the inversion and using that inversion for synthetic data made from virtual prototype echo train results and for field data. The inversion used discretized T1 and T2 values with Tikhonov regularization.

Figure 22:
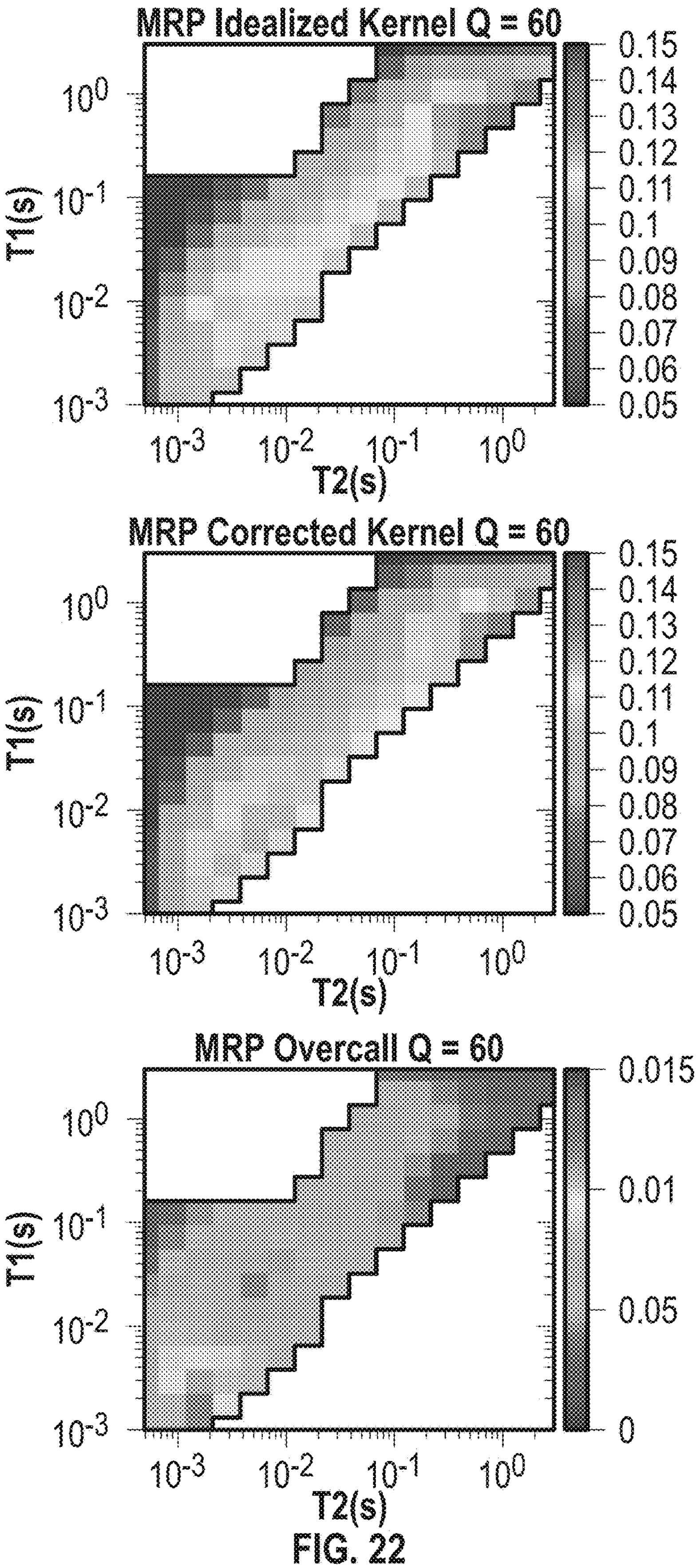
FIG. 22 demonstrates inversion results for synthetic data, in accordance with embodiments of the present disclosure.

FIG. 22 demonstrates inversion results for synthetic data. Virtual prototypes of echo trains for T1-T2 pairs within the range of reasonable inversion sensitivity (these points are present on the maps of FIG. 22) were taken with porosity 0.10, noise was added to them with magnitude of 0.02 per echo that is typical for CMR Plus filed acquisition. 300 depth samples that differ only with noise realization have been generated for each T1-T2 pair. Inversion has been performed without and with kernel correction and mean magnetic resonance porosity (MRP) inversion results have been plotted. It can be seen that, without correction, MRP is overestimated and kernel correction delivers MRP that is closer to the expected value of 0.1. MRP overcall (e.g., the difference between MRP obtained with idealized kernel as per equation (6) and one obtained with corrected kernel as per equation (11)) is especially high in the area of low T2 that is important for unconventional reservoirs.

Figure 23:
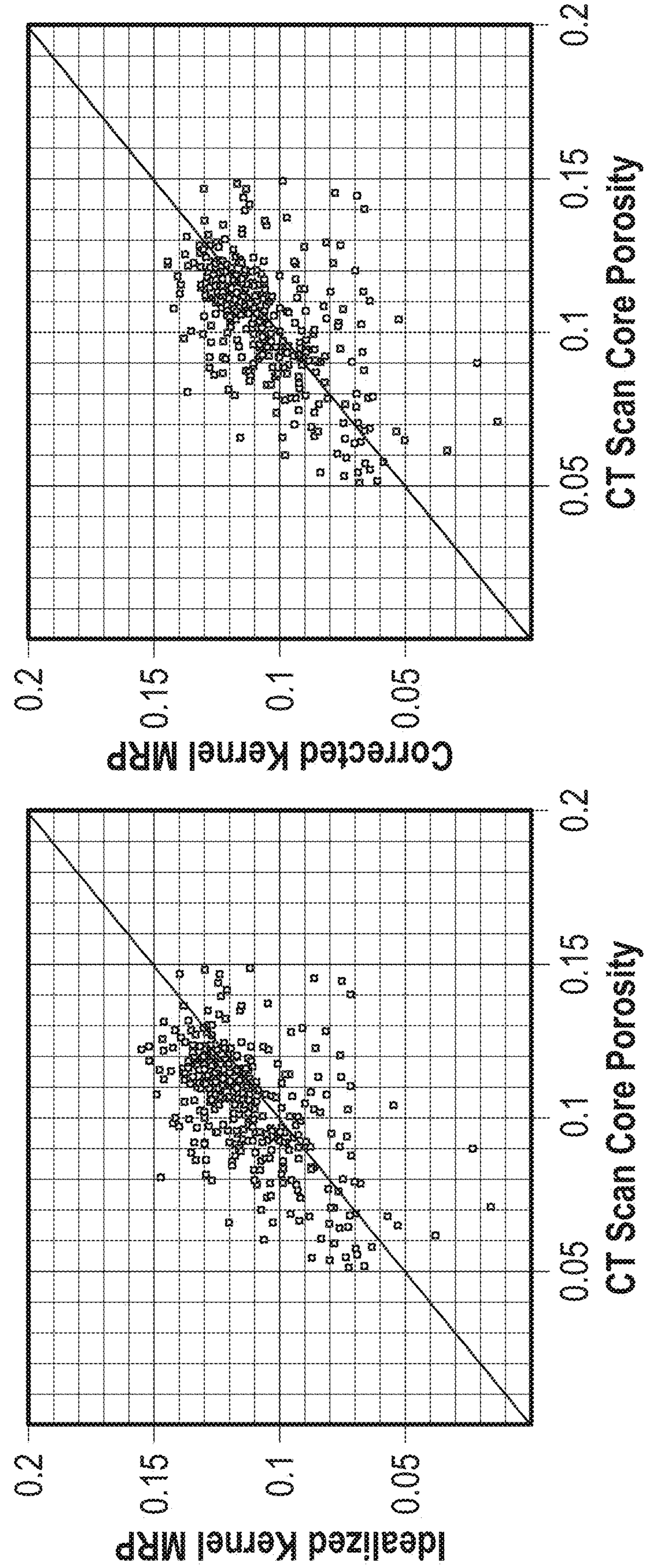
FIG. 23 demonstrates some magnetic resonance porosity (MRP) results vs. core, in accordance with embodiments of the present disclosure.
Figure 24:
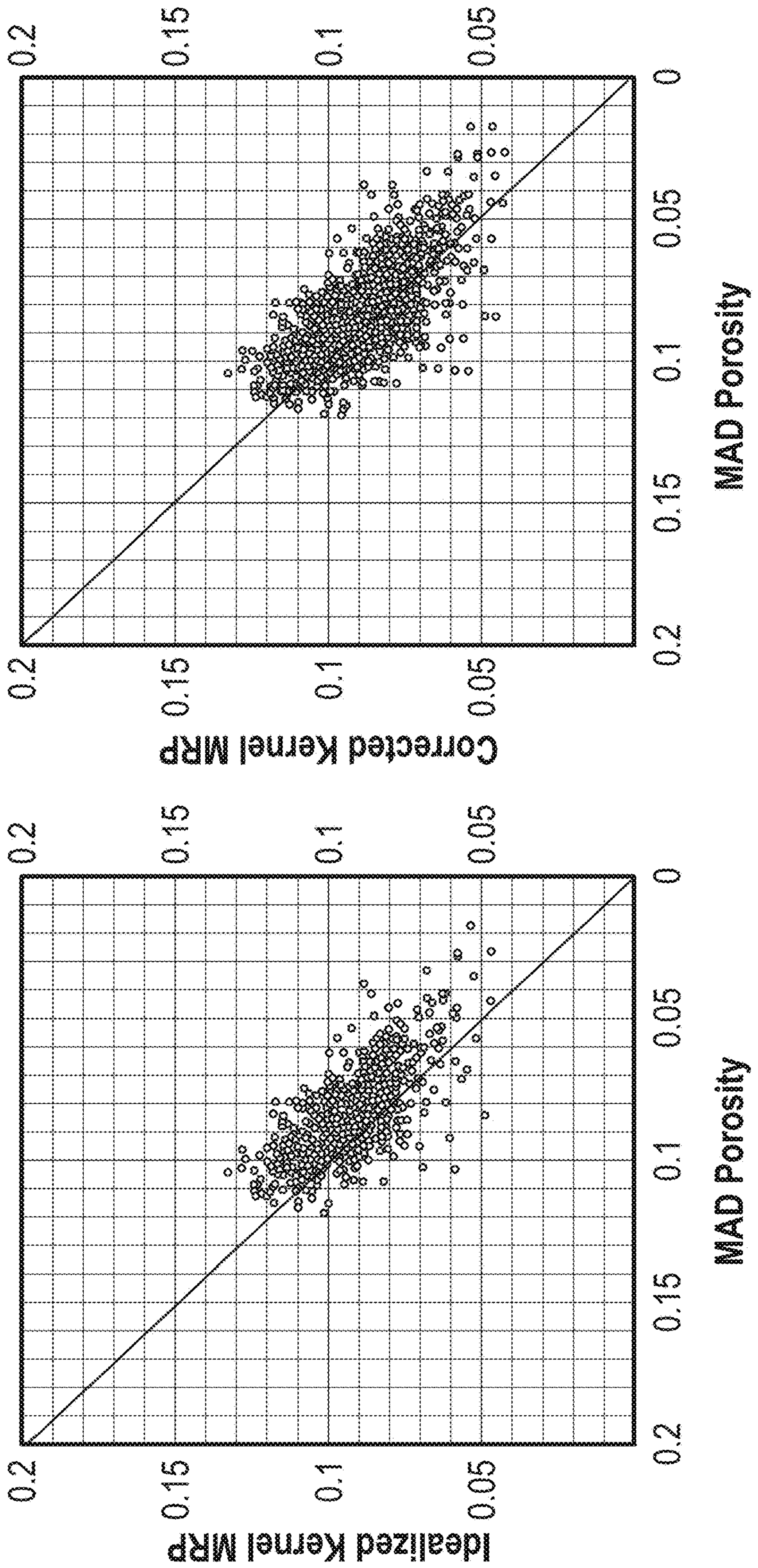
FIG. 24 demonstrates MRP results vs. nuclear logs, in accordance with embodiments of the present disclosure.

NMR inversion without and with kernel correction have been also run on a certain filed data. FIG. 23 demonstrates some MRP results vs. core, whereas FIG. 24 demonstrates MRP results vs. nuclear logs, specifically matrix adjusted density (MAD) porosity. As shown, porosity overcall (i.e., positive porosity bias) is significantly mitigated with the kernel correction. This fact serves as an important additional justification of the embodiments described herein.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The invention claimed is:

1. A method, comprising:

building a computational model for a nuclear magnetic resonance (NMR) downhole tool as a virtual prototype, wherein the virtual prototype models NMR echo trains for the NMR downhole tool, wherein the NMR echo trains are generated by segmented Carr-Purcell-Meiboom-Gill (CPMG) acquisition sequences having a plurality of segments separated by variable wait time periods, and wherein the virtual prototype models steady state build-up (SSBU) effects associated with the segmented CPMG acquisition sequences;

performing virtual prototyping on NMR acquisition sequences comprising the segmented CPMG acquisition sequences with a set of T1-T2 sources for T1-T2 pairs for one or more downhole wells to produce virtual prototyping results, wherein T1 and T2 are representative of first and second relaxation times detected by the NMR downhole tool;

performing simulations of the virtual prototyping results to determine inversion regularization parameters;

performing NMR inversion of T1-T2 maps by applying Tikhonov regularization using the inversion regularization parameters to invert fluid volumes from the virtual prototyping results within selected regions of T1-T2 space associated with the virtual prototyping results; and correcting inverted T1-T2 maps for bias using correction functions generated from the virtual prototyping results to compensate for SSBU-induced distortion.

2. The method of claim 1, wherein the virtual prototype models effects of NMR spin dynamics and variation of operating conditions of the NMR downhole tool.

3. The method of claim 2, wherein the operating conditions of the NMR downhole tool comprise transmission pulse strength and receiver bandwidth characterized by a quality factor (Q) of an antenna of the NMR downhole tool.

4. The method of claim 1, wherein the plurality of segments comprise respective CPMG echo trains separated by different wait time (WT) periods.

5. The method of claim 1, wherein the simulations comprise a Monte-Carlo simulation.

6. The method of claim 1, wherein the virtual prototyping results comprises synthetic echo traces.

7. The method of claim 6, comprising performing the simulations to determine the synthetic echo traces of the virtual prototyping results by adding independent Gaussian noise of a magnitude representing conditions of the NMR acquisition sequences.

8. The method of claim 1, comprising estimating bias as a difference between input fluid volume and a fluid volume obtained from the NMR inversion of the virtual prototyping results.

9. The method of claim 1, wherein performing simulations of the virtual prototyping results comprises performing Monte-Carlo simulations on synthetic NMR echo trains generated by the virtual prototype to determine the inversion regularization parameters.

10. A method, comprising:

building a computational model for a nuclear magnetic resonance (NMR) downhole tool as a virtual prototype, wherein the virtual prototype models NMR echo trains for the NMR downhole tool, and wherein the NMR echo trains are acquired for a specific depth interval, wherein the NMR echo trains are generated by segmented Carr-Purcell-Meiboom-Gill (CPMG) acquisition sequences having a plurality of segments separated by variable wait time periods, and wherein the virtual prototype models steady state build-up (SSBU) effects associated with the segmented CPMG acquisition sequences;

performing virtual prototyping on NMR acquisition sequences comprising the segmented CPMG acquisition sequences with a set of T1-T2 sources for T1-T2 pairs for one or more downhole wells to produce virtual prototyping results, wherein T1 and T2 are representative of first and second relaxation times detected by the NMR downhole tool;

performing simulations of the virtual prototyping results to determine inversion regularization parameters;

performing NMR inversion of two-dimensional (2D) T1-T2 maps using the inversion regularization parameters to invert fluid volumes from the virtual prototyping results within selected regions of T1-T2 space associated with the virtual prototyping results;

performing variable depth averaging of the 2D T1-T2 maps on a per T1-T2 basis; and correcting inverted 2D T1-T2 maps for bias using correction functions generated from the virtual prototyping results to compensate for SSBU-induced distortion.

11. The method of claim 10, wherein variable depth averaging of the 2D T1-T2 maps on a per T1-T2 basis is performed prior to the NMR inversion of the 2D T1-T2 maps by stacking different echo train segments and sub-measurements with different stacking levels.

12. The method of claim 10, wherein variable depth averaging of the 2D T1-T2 maps on a per T1-T2 basis is performed after the NMR inversion of the 2D T1-T2 maps by stacking 2D T1-T2 maps with different stacking levels on a per T1-T2 basis.

13. The method of claim 10, wherein the virtual prototype models effects of NMR spin dynamics and variation of operating conditions of the NMR downhole tool.

14. The method of claim 13, wherein the operating conditions of the NMR downhole tool comprise transmission pulse strength and receiver bandwidth characterized by a quality factor (Q) of an antenna of the NMR downhole tool.

15. The method of claim 10, wherein the plurality of segments comprise respective CPMG echo trains separated by different wait time (WT) periods.

16. The method of claim 10, wherein the simulations comprise a Monte-Carlo simulation.

17. The method of claim 10, wherein the virtual prototyping results comprise synthetic echo traces.

18. The method of claim 17, comprising performing the simulations to determine the synthetic echo traces of the virtual prototyping results by adding independent Gaussian noise of a magnitude representing conditions of the NMR sequences.

19. A method, comprising:

building a computational model for a nuclear magnetic resonance (NMR) downhole tool as a virtual prototype, wherein the virtual prototype models NMR echo trains for the NMR downhole tool, wherein the NMR echo trains are generated by segmented Carr-Purcell-Meiboom-Gill (CPMG) acquisition sequences having a plurality of segments separated by variable wait time periods, and wherein the virtual prototype models steady state build-up (SSBU) effects associated with the segmented CPMG acquisition sequences;

validating the virtual prototype with laboratory experimental data;

selecting one or more virtual prototype parameters based at least in part on the laboratory experimental data;

performing virtual prototyping on NMR acquisition sequences comprising the segmented CPMG acquisition sequences with a set of T1-T2 sources for T1-T2 pairs for one or more downhole wells to produce virtual prototyping results, wherein T1 and T2 are representative of first and second relaxation times detected by the NMR downhole tool;

parameterizing an NMR kernel and its associated parameters as time values corresponding to exponential echo train decay, wherein parameterizing the NMR kernel comprises adjusting amplitudes of acquisition sub-sequences of the NMR acquisition sequences corresponding to different wait times for every T1-T2 pair and a quality factor (Q) of an antenna of the NMR downhole tool to match the virtual prototype;

performing simulations of the virtual prototyping results to determine inversion regularization parameters;

performing NMR inversion of T1-T2 maps using an adjusted NMR kernel having parameters adjusted based at least in part on the parameterized NMR kernel and by applying Tikhonov regularization using the inversion regularization parameters to invert fluid volumes from the virtual prototyping results within selected regions of T1-T2 space associated with the virtual prototyping results; and correcting inverted T1-T2 maps for bias using correction functions generated from the virtual prototyping results to compensate for SSBU-induced distortion.

20. The method of claim 19, wherein the virtual prototype models effects of NMR spin dynamics and variation of operating conditions of the NMR downhole tool.

21. The method of claim 20, wherein the operating conditions of the NMR downhole tool comprise transmission pulse strength and receiver bandwidth characterized by a quality factor (Q) of an antenna of the NMR downhole tool.

22. The method of claim 19, wherein the plurality of segments comprise respective CPMG echo trains separated by different wait time (WT) periods.

* * * * *